US010811460B2

(12) United States Patent
Dimitropoulos et al.

(10) Patent No.: US 10,811,460 B2
(45) Date of Patent: Oct. 20, 2020

(54) MICROMETER SCALE LIGHT EMITTING DIODE DISPLAYS ON PATTERNED TEMPLATES AND SUBSTRATES

(71) Applicant: LUMILEDS HOLDING B.V., Schiphol (NL)

(72) Inventors: Costas Dimitropoulos, Redwood City, CA (US); Sungsoo Yi, Sunnyvale, CA (US); John Edward Epler, San Jose, CA (US); Byung-Kwon Han, Santa Clara, CA (US)

(73) Assignee: Lumileds Holding B.V., Schiphol (NL)

( * ) Notice: Subject to any disclaimer, the term of this patent is extended or adjusted under 35 U.S.C. 154(b) by 0 days.

(21) Appl. No.: 16/144,751

(22) Filed: Sep. 27, 2018

(65) Prior Publication Data
US 2020/0105824 A1    Apr. 2, 2020

(51) Int. Cl.
*H01L 27/15*    (2006.01)
*H01L 33/20*    (2010.01)
*H01L 33/00*    (2010.01)

(52) U.S. Cl.
CPC ........ *H01L 27/156* (2013.01); *H01L 33/0075* (2013.01); *H01L 33/20* (2013.01)

(58) Field of Classification Search
None
See application file for complete search history.

(56) References Cited

U.S. PATENT DOCUMENTS

| 6,410,942 B1 | 6/2002 | Thibeault et al. |
| 6,657,236 B1 | 12/2003 | Thibeault et al. |
| 6,821,804 B2 | 11/2004 | Thibeault et al. |

(Continued)

FOREIGN PATENT DOCUMENTS

| EP | 3410002 A1 | 12/2018 |
| EP | 3410003 A1 | 12/2018 |

(Continued)

OTHER PUBLICATIONS

Chang et al., "Boosting Brightness with V-Shaped Pits," Compound Semiconductor Magazine, vol. 21, Issue VII, pp. 48-52, (2015).

(Continued)

*Primary Examiner* — Reema Patel
*Assistant Examiner* — Steven M Christopher
(74) *Attorney, Agent, or Firm* — Servilla Whitney LLC

(57) ABSTRACT

A uLED and method for regrowth with thinner deposition on sidewall are disclosed. The uLED and method include a growth substrate including flat first and second regions, where the growth substrate is thicker in the first region as compared to the second region, and a third region of sloped sidewalls connecting the first and second regions, the topography forming a regular geometric pattern, a plurality of semiconductor epitaxial layers covering the first, second, and third regions including at least a p-n junction layer including a light emitting active region of direct bandgap semiconductor, sandwiched between n-type and p-type layers, each of the plurality of semiconductor epitaxial layers being thicker on the first and second regions as compared to the corresponding semiconductor epitaxial layers on the third region, and a plurality of electrical contacts forming an anode and cathode on part of the first and second regions, respectively.

20 Claims, 25 Drawing Sheets

(56) References Cited

U.S. PATENT DOCUMENTS

| | | |
|---|---|---|
| 9,112,112 B2 | 8/2015 | Do et al. |
| 9,192,290 B2 | 11/2015 | Spinnler et al. |
| 9,484,492 B2 | 11/2016 | Bour et al. |
| 9,496,465 B2 | 11/2016 | Sugimoto et al. |
| 9,507,204 B2 | 11/2016 | Pelka et al. |
| 9,601,659 B2 | 3/2017 | Bour et al. |
| 9,722,160 B2 | 8/2017 | Nakabayashi |
| 9,865,772 B2 | 1/2018 | Bour et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,193,013 B2 | 1/2019 | Bour et al. |
| 2004/0129929 A1 | 7/2004 | Okuyama et al. |
| 2007/0200135 A1* | 8/2007 | Wang ............... H01L 33/24 257/103 |
| 2009/0032799 A1* | 2/2009 | Pan ............... H01L 33/24 257/13 |
| 2010/0264441 A1 | 10/2010 | Kim |
| 2012/0074441 A1 | 3/2012 | Seo et al. |
| 2014/0094878 A1 | 4/2014 | Gossler et al. |
| 2014/0166974 A1 | 6/2014 | Yoo et al. |
| 2014/0225059 A1* | 8/2014 | Yang ............... H01L 33/145 257/13 |
| 2015/0228873 A1 | 8/2015 | Gebuhr et al. |
| 2016/0087150 A1 | 3/2016 | Ristic et al. |
| 2016/0190400 A1 | 6/2016 | Jung et al. |
| 2016/0197232 A1 | 7/2016 | Bour et al. |
| 2016/0293811 A1 | 10/2016 | Hussell et al. |
| 2017/0012175 A1 | 1/2017 | Wang et al. |
| 2017/0098746 A1 | 4/2017 | Bergmann et al. |
| 2017/0162746 A1* | 6/2017 | Cha ............... H01L 33/385 |
| 2017/0243860 A1 | 8/2017 | Hong et al. |
| 2017/0293065 A1 | 10/2017 | Kim |
| 2017/0358563 A1 | 12/2017 | Cho et al. |
| 2017/0358724 A1 | 12/2017 | Shichijo et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0182275 A1 | 6/2018 | Ahmed et al. |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2019/0067522 A1 | 2/2019 | Chang et al. |
| 2019/0115495 A1 | 4/2019 | Bour et al. |

FOREIGN PATENT DOCUMENTS

| | | |
|---|---|---|
| JP | 2016066765 A | 4/2016 |
| KR | 20140118466 A | 10/2014 |
| KR | 20170018687 A | 2/2017 |
| KR | 20180010670 A | 1/2018 |
| KR | 20180114413 A | 10/2018 |
| WO | 2008091846 A2 | 7/2008 |
| WO | 2012/059837 A1 | 5/2012 |
| WO | 2017102708 A1 | 6/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |

OTHER PUBLICATIONS

PCT International Search Report and Written Opinion in PCT/US2019/053694 dated Nov. 29, 2019, 18 pages.

Non-Final Office Action in U.S. Appl. No. 16/584,941 dated Apr. 21, 2020, 9 pages.

\* cited by examiner

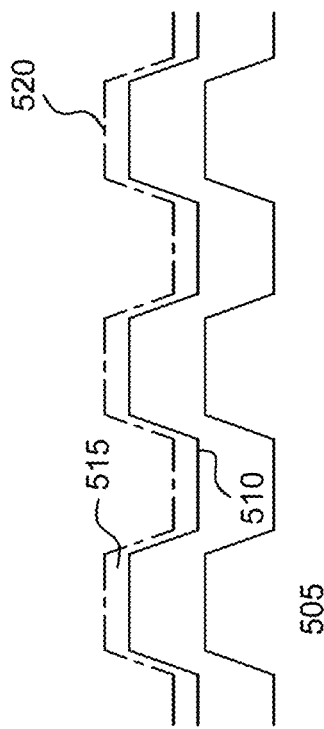
FIG. 5A
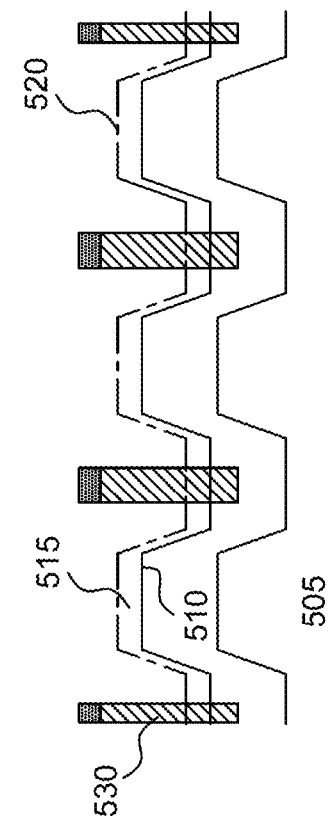
FIG. 5B
FIG. 5D
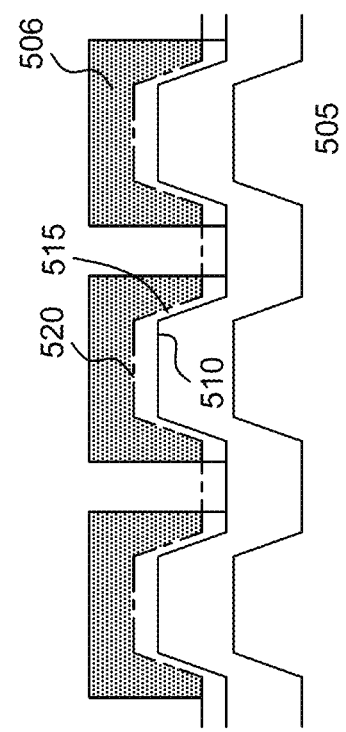
FIG. 5C

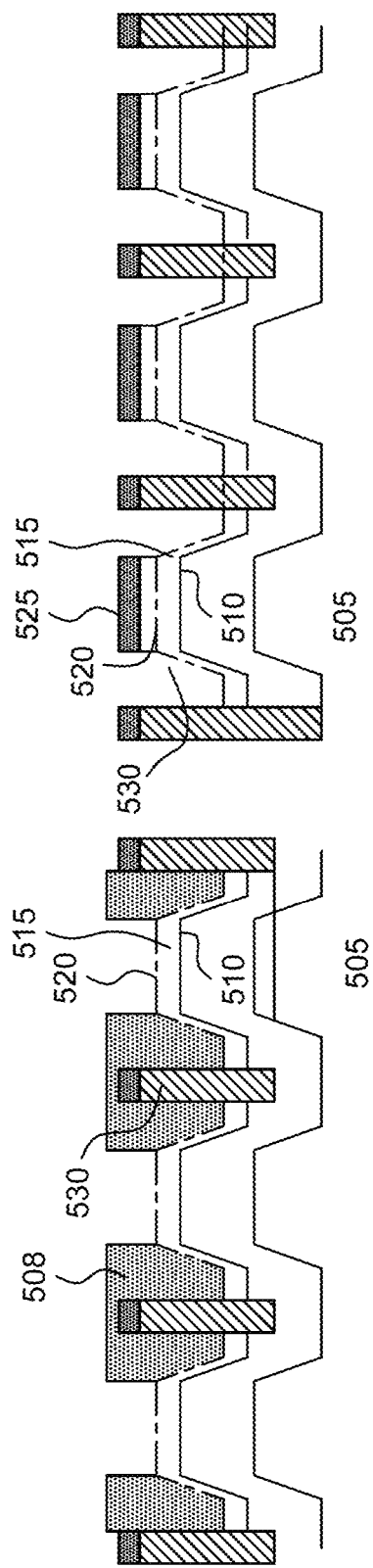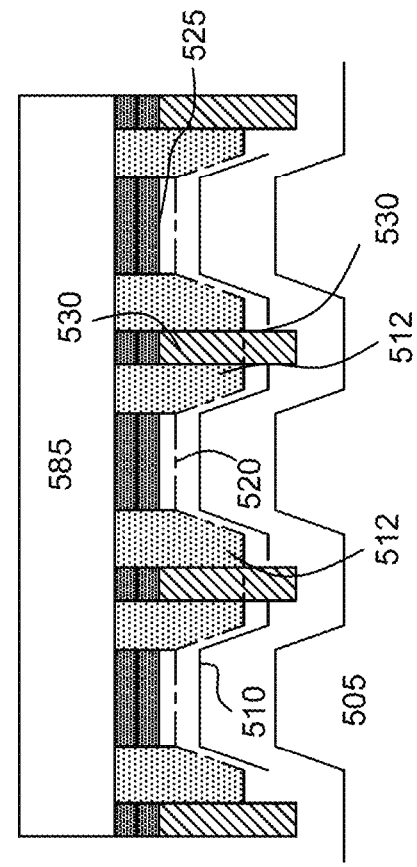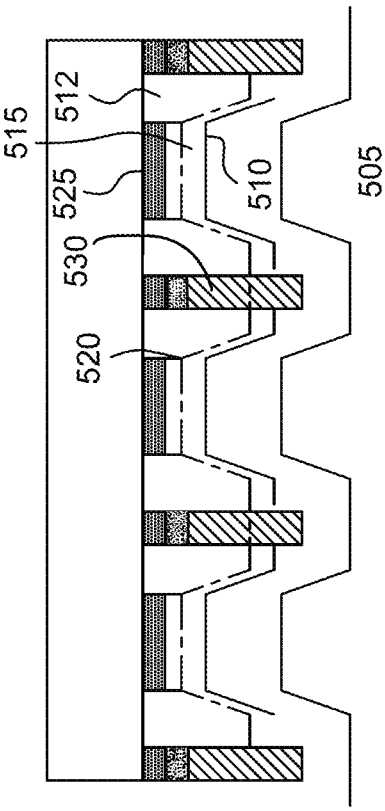

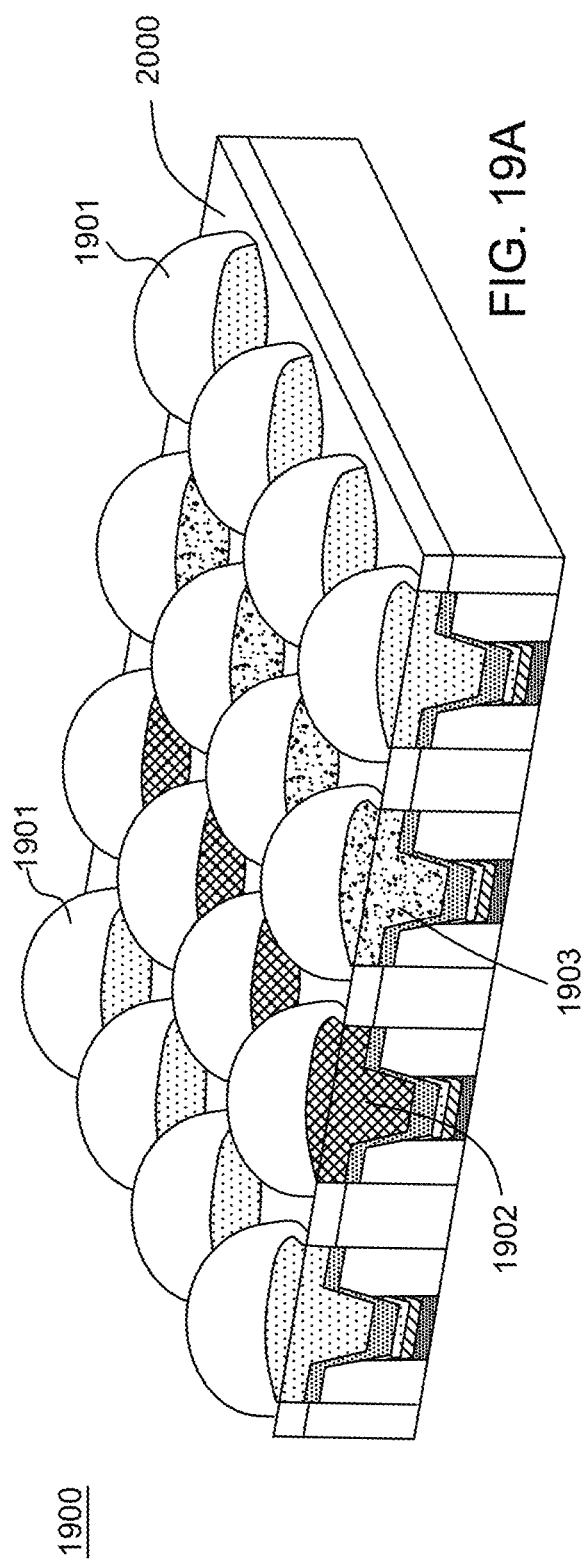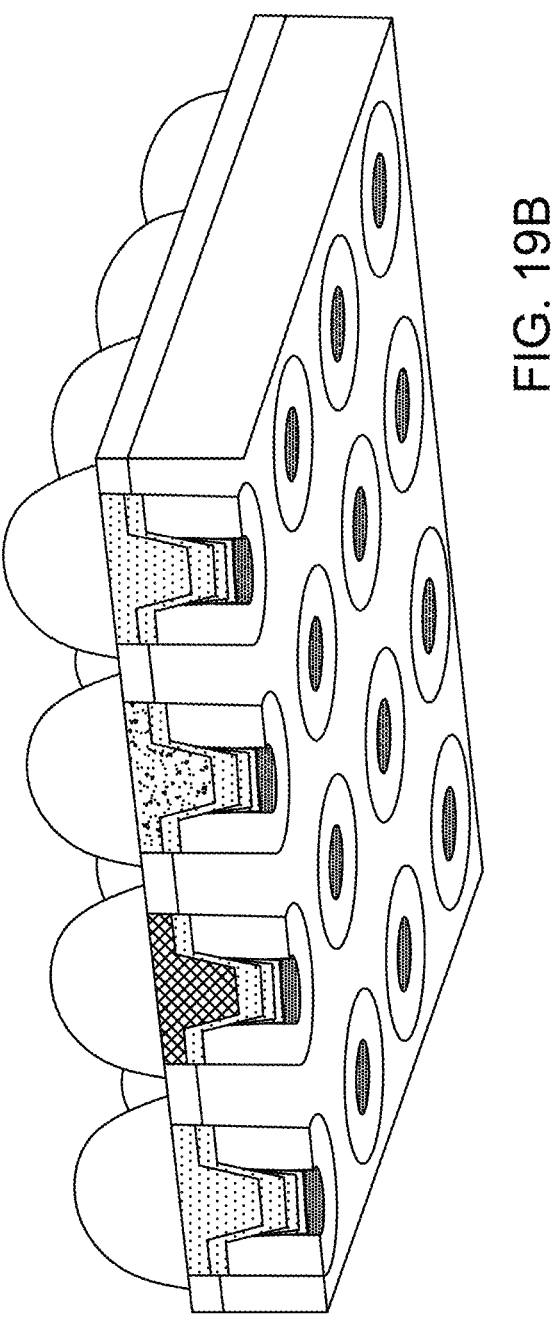
FIG. 19A
FIG. 19B

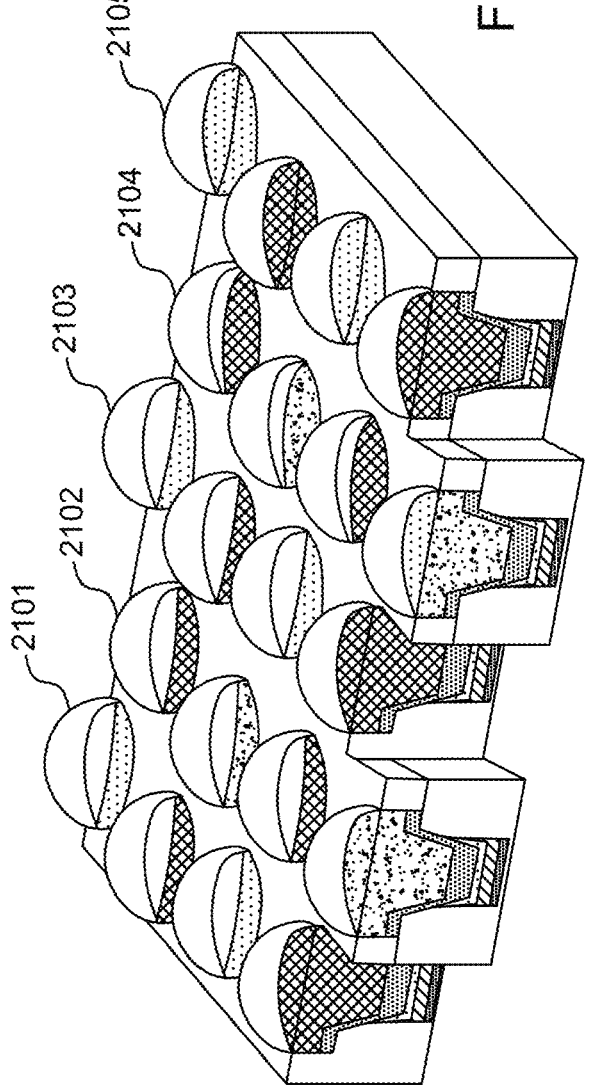
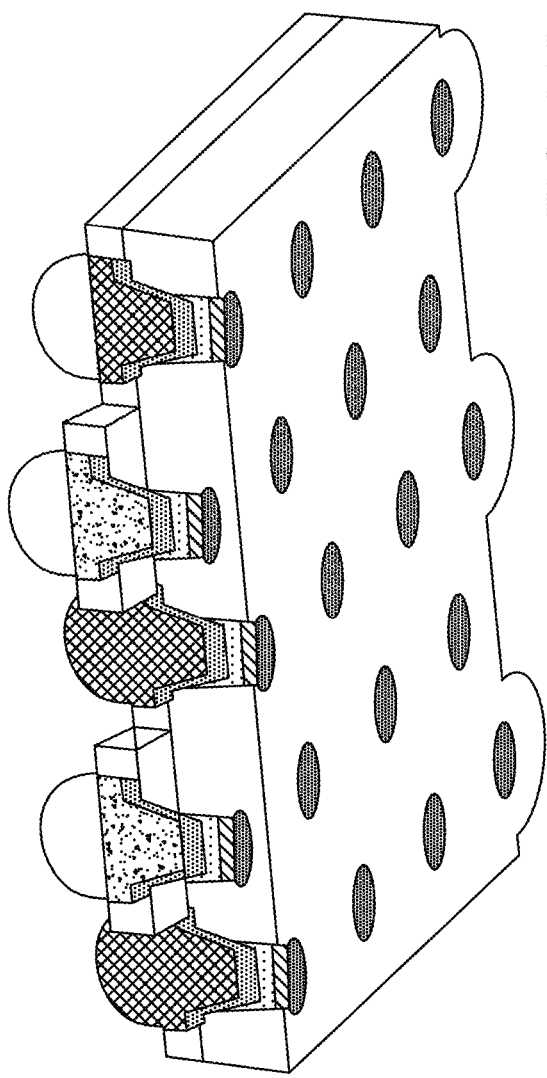
FIG. 21A
FIG. 21B

MICROMETER SCALE LIGHT EMITTING DIODE DISPLAYS ON PATTERNED TEMPLATES AND SUBSTRATES

FIELD OF INVENTION

The present invention is related to micrometer scale light emitting diode displays on patterned templates and substrates.

BACKGROUND

Light emitting diodes (LEDs) have emerged as an appealing light source for many applications. From road signage and traffic signals, LEDs are currently becoming dominant in general lighting, automotive, mobile electronics, camera flash, display backlighting, horticulture and sanitization applications. Typical benefits of LEDs compared to competing light sources are increased efficiency, longer lifespan and adaptability to a large variety of form factors.

One type of LEDs that exhibit leading efficiency and lifespan are inorganic semiconductor-based, hereafter referred to as simply LEDs. In these LEDs, the diode typically includes one or more semiconductor-based quantum well light-emitting layers sandwiched between thicker semiconductor-based outer layers conducting the current.

An emerging application of LEDs is in directly illuminated displays, where the increased efficiency and longer lifespan of LEDs makes the LEDs an attractive replacement for organic LEDs (OLEDs), which are the current dominant technology. The high luminous efficacy of LEDs (lumens per watt; >100 Lm/W) allows for lower power consumption usage compared to OLEDs, as well as reduced heat generation. The reduction in heat, in conjunction with the increased chemical stability of inorganic LEDs compared to OLEDs improves the relative lifetime of a corresponding display. Similarly, the higher efficacy of inorganic LEDs allows for a smaller chip area to achieve a given system brightness, which reduces cost compared to an OLED array. This is particularly applicable to large area displays such as monitors. In order to deploy LEDs for high density display applications or for large area, medium density applications, the LED unit is desired to have a characteristic dimension of 100 micrometers or less, with typical values in the 8 to 25 micrometer range. This class of LEDs is commonly referred to as micro-LEDs (uLEDs).

SUMMARY

A uLED and method for regrowth with thinner deposition on sidewall are disclosed. The uLED and method include a growth substrate including flat first and second regions, where the growth substrate is thicker in the first region as compared to the second region, and a third region of sloped sidewalls connecting the first and second regions, the topography forming a regular geometric pattern, a plurality of semiconductor epitaxial layers covering the first, second, and third regions, including at least a p-n junction layer, including a light emitting active region of direct bandgap semiconductor, sandwiched between n-type and p-type layers, each of the plurality of semiconductor epitaxial layers being thicker on the first and second regions as compared to the corresponding semiconductor epitaxial layers on the third region, and a plurality of electrical contacts forming an anode and cathode on part of the first and second regions, respectively.

A method for forming a uLED regrowth with thinner depositions on the sidewall is disclosed. The method includes forming a patterned sapphire substrate (PSS), growing an epitaxial layer, applying resist and patterning the epitaxial layer, etching through the epitaxial layer, depositing n-contact metals, lifting off n-contact metals, applying resist and patterning the epitaxial layer a second time, depositing p-contact metals, lifting off p-contact metals, bonding to the TFT backplane, injecting TiOx filled silicone underfill, and removing the growth substrate. The method may also include submicron patterning of exposed semiconductor. The method may also include depositing a phosphor layer. The method may also include adding optical elements.

A method for forming a uLED regrowth with thinner depositions on the sidewall is disclosed. The method includes forming a PSS, growing an epitaxial layer, applying resist and patterning the epitaxial layer, depositing and lifting off of p-contact and band metals, bonding to the TFT backplane, injecting TiOx filled silicone underfill, and removing the growth substrate. The method may also include submicron patterning of exposed semiconductor. The method may also include depositing n-contact and optical isolation metals. The method may also include depositing a phosphor layer. The method may also include adding optical elements.

BRIEF DESCRIPTION OF THE DRAWINGS

A more detailed understanding may be had from the following description, given by way of example in conjunction with the accompanying drawings wherein:

FIGS. 5A-L illustrate a monolithic LED array (Thin Film Flip Chip) at various stages of the workflow;

FIGS. 19A and B illustrate a monolithic TFFC array of uLEDs using phosphor conversion and optical isolation that does not require pick and place;

FIGS. 21A and B illustrate a monolithic VTF array of uLEDs using phosphor conversion and optical isolation that does not require pick and place.

DETAILED DESCRIPTION

Figure 1A:
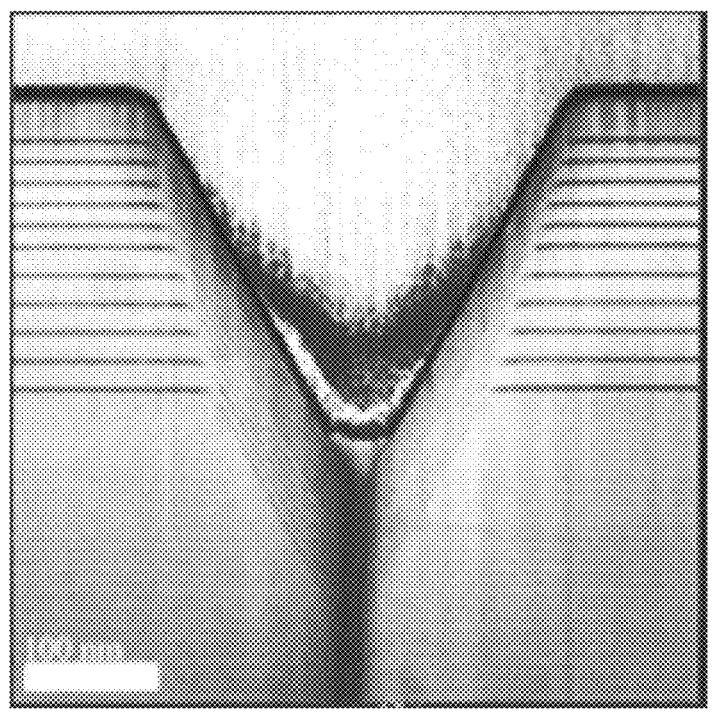
FIG. 1A illustrates a variation of epitaxial growth rate on different crystallographic planes and correlation to epitaxial structure on patterned substrates.

At the typical dimensions for uLEDs, the luminous efficacy may suffer additional losses compared to LEDs with characteristic dimensions of 100 micrometers or larger. The main reason is that in a typical LED, an etch cutting through the epitaxial active region borders the electrically active part of the device. Defects at the etch sidewall accelerate non-radiative carrier (electron and hole) recombination where heat is generated instead of light. Also, the defects can compensate p-type material, converting the layer to n-type and creating a path for leakage currents. In either case, the sidewall or edge effect creates an inefficient border area. As device dimensions and drive currents decrease, the impact of the sidewall affects increase. For example, in AlInGaP devices, non-radiative centers at the die edge may reduce light emission over a range of order 5 um, so a 50 um device might suffer a 20% deficit in efficiency while a 15 um device would suffer a greater than 50% deficit in efficiency.

Attempts have been made to passivate the sidewalls to reduce or eliminate recombination that typically involve deposition of epitaxial layers, masks and directional diffusion. These attempts, putting success levels aside, lead to larger manufacturing complexity, higher cost and less flexibility in layout design. In addition, the effectiveness of proposed passivation layers has not been established conclusively, as it depends on the interaction details between the uLED active region and the deposited material. It is not clear, for example, to what extent the passivating material prevents carrier transport to the sidewall.

This invention addresses the aforementioned loss mechanism, and is based upon established carrier transport physics which is independent of the dimension of the uLED. In addition, it allows for economical fabrication of uLEDs and flexibility in fabrication of monolithic uLED devices (displays) from a wafer.

In fabricating uLED displays, it is commonly understood that each uLED die or group of uLED dies are transferred to a TFT backplane by pick-and-place methods. When the display resolution and size increase, the number of transferred die increases. The cost to fabricate HD or 4K display panels, requiring millions of die transfers, becomes too high to realize commercially viable products. The direct emission uLEDs may be difficult to fabricate because of the requirements for uniform emission wavelength and minimal color shift with drive current. Red emitting uLED based upon AlInGaP may suffer from temperature sensitivity of efficiency.

The embodiments of the invention described in this disclosure include a monolithic full color display that eliminates the costly die-transfer and simplifies the fabrication process. Also, monolithic TFFC or VTF arrays may be less challenging to manufacture because the requirements on wavelength uniformity and wavelength shift with drive current are reduced for a phosphor converted uLED, and the growth of uniform, high efficiency, low droop epitaxies with less wavelength shift is easier in the near-UV (NUV) emission. The growth of NUV emitting epitaxies is known to be less challenging than, for example, green emitting epitaxy. Although limited to relatively small physical dimensions, the invention enables commercialization of display panels of greater than 4K resolution, in a compact form factor suitable for Virtual/Mixed/Augmented Reality hardware, projectors, and high end wearables. The provided display is a thin film device limited in flexibility by the TFT backplane and may support flexible or curved displays. Finally, coupling of optical elements may be done in an efficient parallel fashion with, for example, over-molding.

In this invention, a patterned template or substrate is provided and combined with appropriate growth conditions to modify the epitaxial layer structure on the semi-polar crystal planes present at the device sidewalls. Specifically, the growth rate on the sloped sidewalls is greatly reduced relative to low index planes. With appropriate epitaxial structure design, p-side carrier transport along the sidewalls is blocked because of high electrical resistance and increased bandgap while n-side lateral current flow is maintained. Current injection is intrinsically limited to the top plateau via the reflective p-contact and p-side leakage currents from p to n-contact are pinched off. Post-growth processing steps normally required to isolate the current injection and passivate the damage of isolation etching are eliminated. Cost saving and a reduction in scale of the devices are realized since each lithography step/thin film layer requires some lateral spacing to accommodate edge effects and alignment runout. The phenomenon of reduced sidewall growth rate is analogous to that observed in MOCVD growth of InGaN LEDs on surfaces containing V-pits. The TEM in FIG. 1A clearly shows the differences in growth rates between crystallographic planes. In the TEM image, the top part of an epitaxially deposited LED where the V-pit feature that is formed on the underlying material is decorated on its sidewalls. The thickness of the dark layers decreases dramatically on the inclined sidewalls of the V-pit feature. The patterned substrate design leverages the same effect to produce the thin sidewall layers discussed above.

Figure 1B:
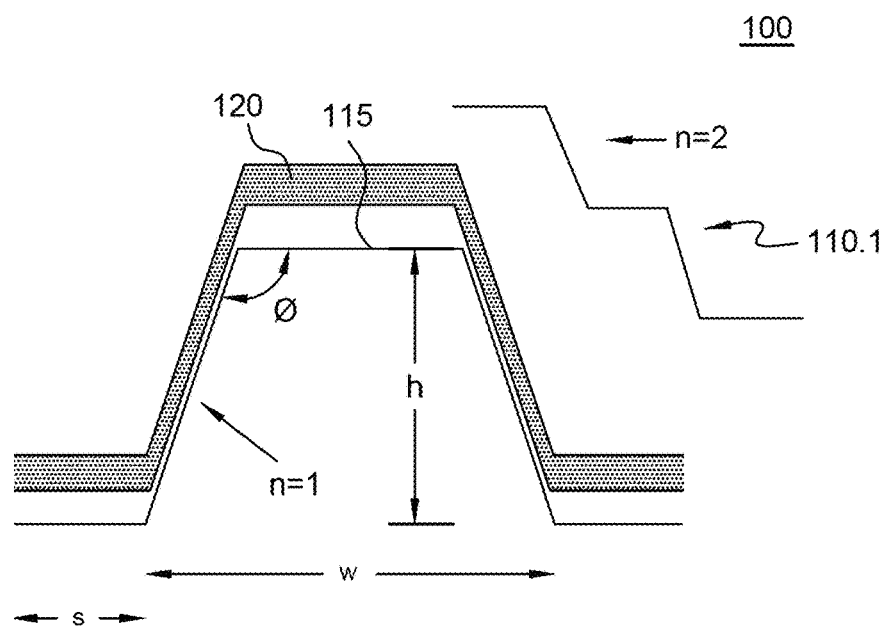
FIG. 1B illustrates a uLED regrowth with thinner deposition on sidewall.

FIG. 1B illustrates a uLED regrowth 100 with thinner deposition on the sidewall. uLED regrowth 100 may be grown on a patterned substrate (not shown) or n-layer 110. As depicted in FIG. 1B, the number of steps in the patterned n-layer 110 may be n=1. A depiction of a patterned n-layer with n=1 is shown as n-layer 110.1. The pattern may include a width w, street width s, a height h, and an angle Φ. Width w may be defined as the width of the pattern at its base. Width w may range from (or be approximately) 2-10 um. Height h may be defined as the height from the base to the top of the pattern. Height h may range from (or be approximately) 2-10 um. Street width s may be defined as the amount of the p-layer 110 (or substrate if substrate is patterned) that does not include the pattern on it. Street width s may be equal on the sides of the pattern for patterns that are centered, or approximately centered, with n-layer 110. Street width s may range from (or be approximately) 2-5 um. The angle of the top of the pattern of n-layer 110 creates with the sidewall of the pattern may be defined as angle Φ. Angle Φ may range from (or be approximately) 45-90 degrees.

On the patterned n-layer 110, there may be epitaxially grown a p-layer 120. This p-layer 120 may take the shape of the patterned n-layer 110 and may maintain a thinner deposition on the sidewall. In between n-layer 110 and p-layer 120 is an active layer 115.

The invention can be realized with sapphire, silicon, silicon carbide, GaN and GaAs substrates or through patterning (n-layer) templates (for example by electron beam lithography) deposited directly on them (in this case, either patterned or planar). Material deposition can be accomplished with established methods for macroscopic LEDs, such as, but not limited to MOCVD, MOVPE, HVPE MBE, RPCVD, Reactive and Non-reactive Sputtering. For example, one can use direct MOCVD growth on the substrate or in conjunction with different deposition technologies, such as reactive sputtering or PVD, to prepare the surface for epi nucleation (for example, aluminum nitride). Moreover, the resulting epitaxial structures are compatible with standard semiconductor processing steps, such as electrical contact formation, optical isolation layers (for example, silicon nitride, silicon oxide, titanium oxide, etc.), growth substrate removal, and interconnects (electroplating, evaporation, etc.). The final result may be singulated element uLEDs for large area displays with sparse arrays or highly dense monolithic arrays for compact displays.

The described embodiments do not limit the variety of substrate patterns and patterning technologies that can be used. It is compatible with wet-etch or dry etch processes, electron beam lithography amongst others. It can also benefit from multilevel patterning technologies, especially those that can be fabricated in a self-aligned way, e.g., using lithography through deposition of different thickness resists to control etch rates. It is compatible with and can benefit from, when necessary, selective etching to further isolate edge/sidewall of the active region from the p-side/n-side.

Figure 2A:
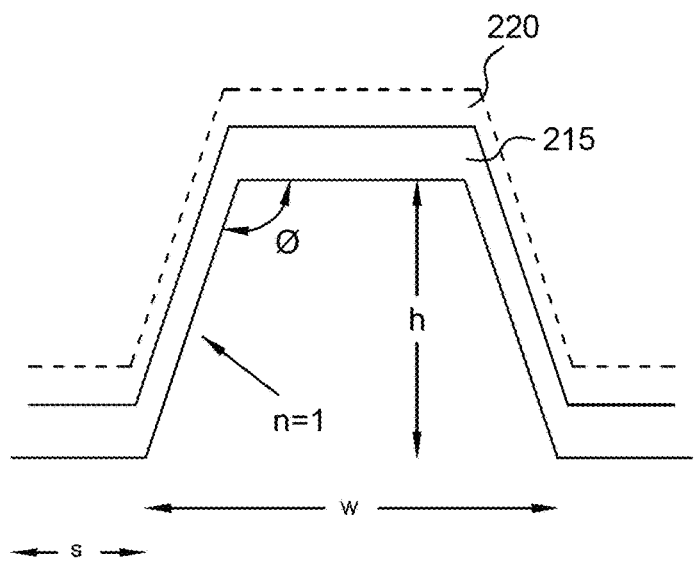
FIGS. 2A and B illustrate a uLED regrowth on patterned template.
Figure 2B:
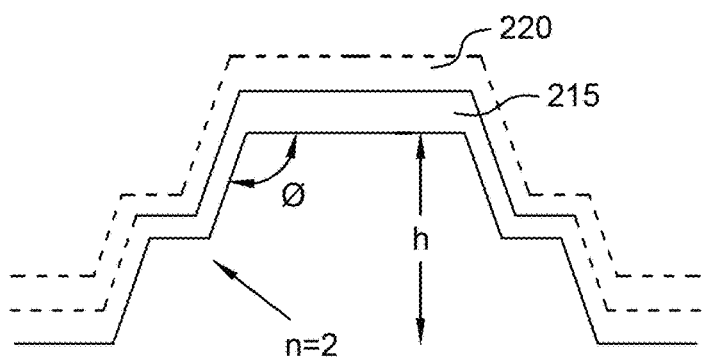

Generally, the embodiments of the invention are based upon growth of an LED structure on a patterned template deposited on a planar substrate or growth on a patterned substrate. By way of example, FIGS. 2A and 2B illustrate a uLED regrowth on patterned template. FIG. 2A illustrates a uLED regrowth 200 with n=1 and FIG. 2B illustrates a uLED regrowth 280 with n=2. Referring now to either, or both, of FIGS. 2A and 2B, a substrate 205 is utilized. Substrate 205 may take the form of planar sapphire, GaN, Si, SiC, GaAs, for example. Substrate 205 may have deposited thereon an n-layer 210. The n-layer 210 may be deposited as an initial template layer for the shape and structure desired. For example, the layer may include a width w, street width s, a height h, and an angle Φ. While the present examples illustrate each shoulder width as identical, such a configuration is not required. FIG. 2A illustrates a single step, while FIG. 2B illustrates a dual step. In essence, n-layer 210 may be patterned by varying any variable include height h, width w, street width s, number of steps n and angle Φ to achieve a desired shape. While each of FIGS. 2A and 2B generally show a trapezoidal pattern with a squared shape, the perimeter shape may be from circular to polygonal, symmetric or elongated.

An active layer 215 may be deposited on n-layer 210 taking the shape and form of n-layer 210 including height h, width w, street width s, number of steps it and angle Φ. Active region 215 may be formed as a layer, also referred to as a cavity, and may take the form of a layer of pGaN. As would be understood by those possessing an ordinary skill the pertinent arts, GaN is a binary III/V direct bandgap semiconductor commonly used in light-emitting diodes. GaN has a crystal structure with a wide band-gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN.

A p-layer 220 may be deposited on active layer 215 taking the shape and form of active layer 215 including height h, width w, street width s, number of steps n and angle Φ. A p-layer 220 may be replaced with a tunnel junction layer, which consists of heavily Mg doped p++-layer and heavily Si-doped n++-layer. Replacing high resistance p-GaN layer with low-resistance n-GaN layer enables facile formation of ohmic contact and improved current spreading, and therefore a reduced contact metal footprint. The resulting epitaxial structure is compatible with the semiconductor fabrication process described herein.

Figure 3:
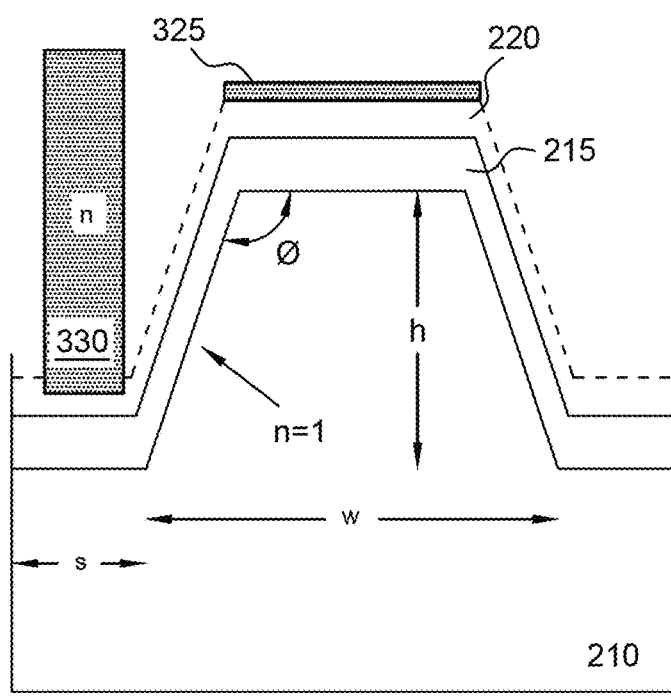
FIG. 3 illustrates a uLED with P- and N-contacts.

FIG. 3 illustrates a uLED of FIG. 2A with p-contact and n-contacts. uLED 300 includes the elements of uLED 200 including n-contact 330 and p-contact 325. N-contact 330 may be formed by exposing n-layer 210 and forming the n-contact 330 thereon. P-contact 325 may be formed on p-layer 220.

Figure 4:
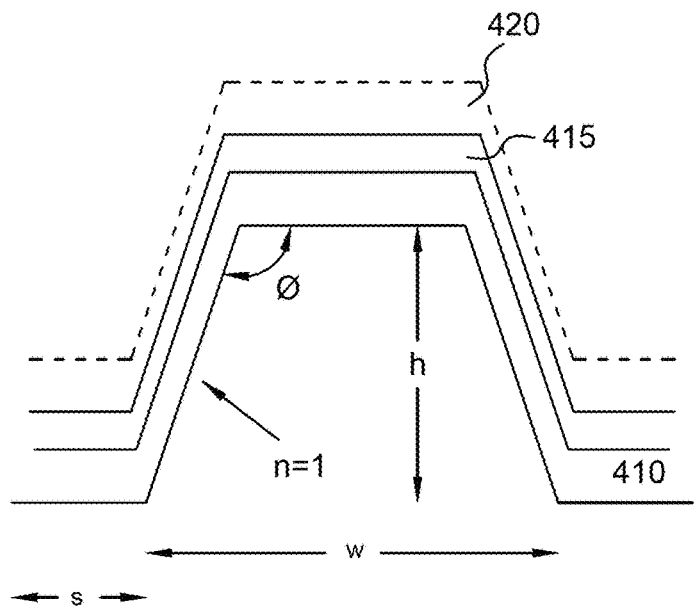
FIG. 4 illustrates a uLED deposition on patterned substrates.

FIG. 4 illustrates a uLED 400 deposition on a patterned substrate 405. Substrate 405 may be formed of sapphire, GaN, Si, SiC, GaAs, for example. As with the n-layer in the previous example, the substrate 405 may be patterned by varying any variable including height h, width w, street width s, number of steps n and angle Φ to achieve desired shape and a perimeter shape may vary from circular to polygonal The n-layer 410 may be deposited on the templated substrate 405 taking the shape and form of substrate 405 including height h, width w, street width s, number of steps n and angle Φ.

An active layer 415 may be deposited on n-layer 410 taking the shape and form of n-layer 410 including height h, width w, street width s, number of steps n and angle Φ imparted from substrate 405.

A p-layer 420 may be deposited on active layer 415 taking the shape and form of active layer 415 including height h, width w, street width s, number of steps n and angle Φ imparted from substrate 405. As discussed with respect to FIG. 3, n- and p-contacts may be formed on uLED 400.

The embodiments depicted in FIGS. 2-4 are primarily singulated LED elements. The mechanism of the PSS growth may determine the range of shapes and dimensions of light-emitting mesas, non-light emitting sidewall areas, and non-light emitting streets. Reflective p-contacts may cover the mesas, and n-contacts may be formed in the streets as shown in FIG. 3. Reflective design elements such as TiOx-Silicon suspensions and non-conductive reflective structures may be employed on the sidewalls to enhance efficiency and optically isolate devices. The substrate patterning may include a very fine nanometer scale (submicron) patterning (random or periodic) to enhance optical outcoupling into the phosphor layer. The roughening may be created after substrate removal by nano-imprint lithography and etching, photoelectrochemical etching or similar methods.

Combinations of the growth in forming uLED 200 and uLED 400 may be used. Combinations of the techniques may be used to achieve desired thickness ratio between flat areas and sidewalls. The thinner sidewalls in each of uLED 200 and uLED 400, and in techniques that are combined, leverage thinner deposition on sidewall to reduce surface sidewall recombination, improve performance, reduce processing and fabrication cost, and expose n-layer and make n- and p-contacts (similar to FIG. 3). The thinner sidewalls may increase p-side electrical resistance and reduce leakage currents. The thinner QW in the active region may increase the bandgap energy of the sidewall material, creating a hole barrier and restraining recombination to the semiconductor under the p-contact 325. The elimination of process steps to isolate n and p-contact reduce fabrication cost and enable smaller feature size. The latter is a result of fewer lithography steps which require an offset to accommodate misalignment.

The thinner deposition on the sidewalls in each of uLED 200 and uLED 400 leverage the thinner deposition on sidewall to create an energy barrier by increasing bandgap (thinner QWs) on sidewall epitaxial layers, increase electrical resistance to current spreading (thinner P-layer), reduce sidewall recombination by blocking hole current flow, improve efficiency by isolating current injection to light emitting region on top of mesa, and reduce processing and fabrication cost.

Examples of layouts for minimizing footprint and maximizing performance and manufacturability are shown in FIGS. 7-16. The light-emitting mesas may be square, rectangular or other types of polygons. The p-contact is typically the largest of the two contacts since the light generation and active region current injection occur principally under the p-contact. A larger p-contact reduces current density and improves efficiency for most operating currents. The size of the n-contact may be smaller to minimize footprint, however an n-contact around the entire perimeter would reduce the current density and electric field in the sidewall regions, minimizing leakage current and Vf.

Figure 5I:
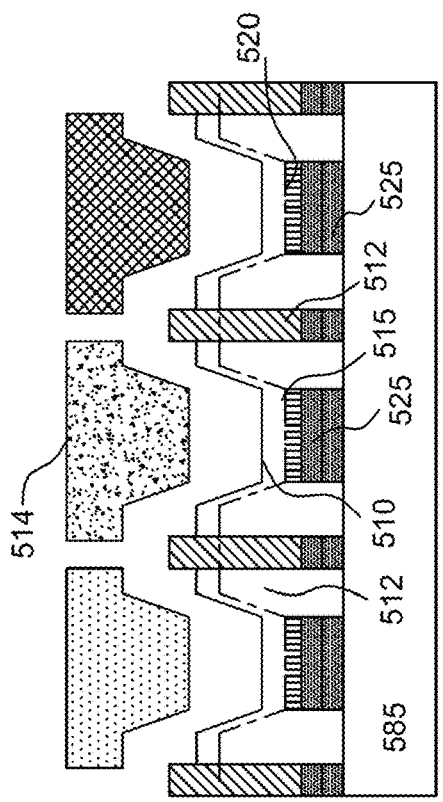
Figure 5J:
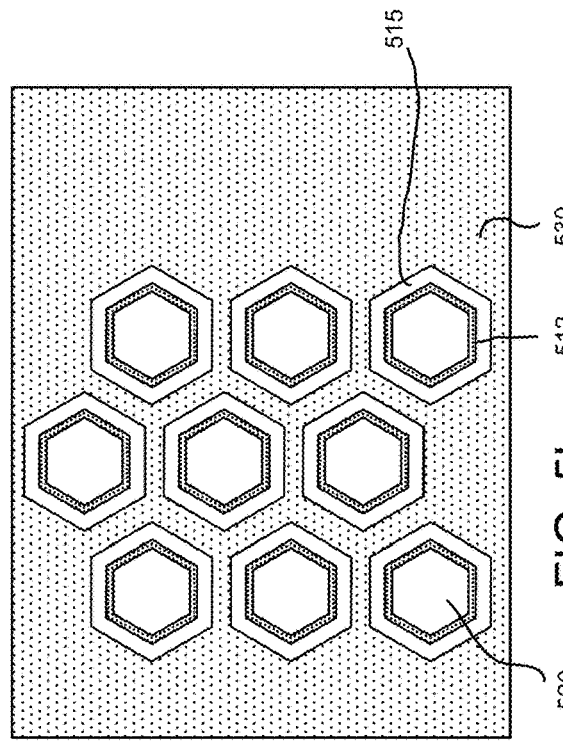
Figure 5K:
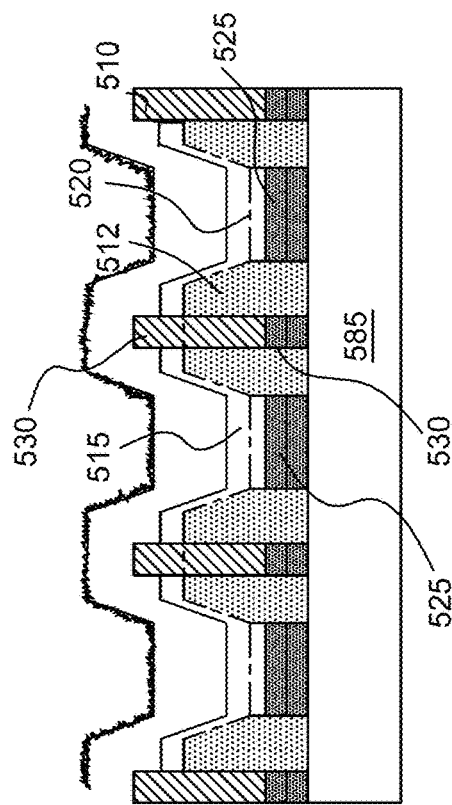
Figure 5L:
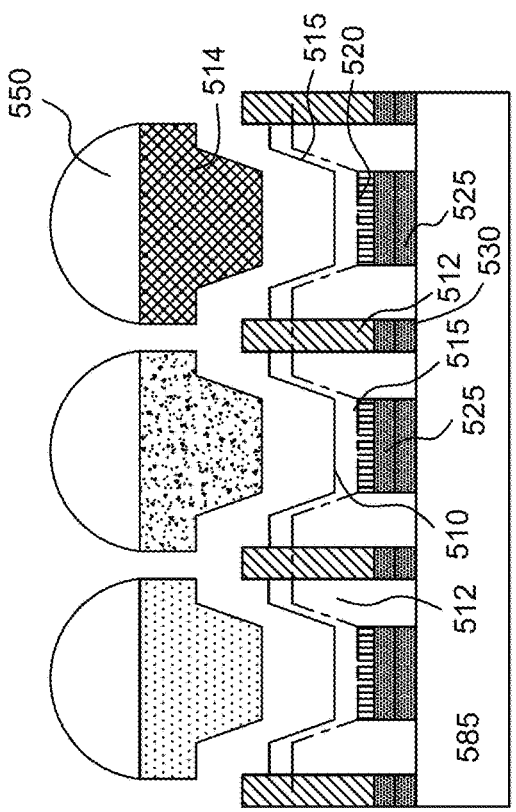
Figure 6:
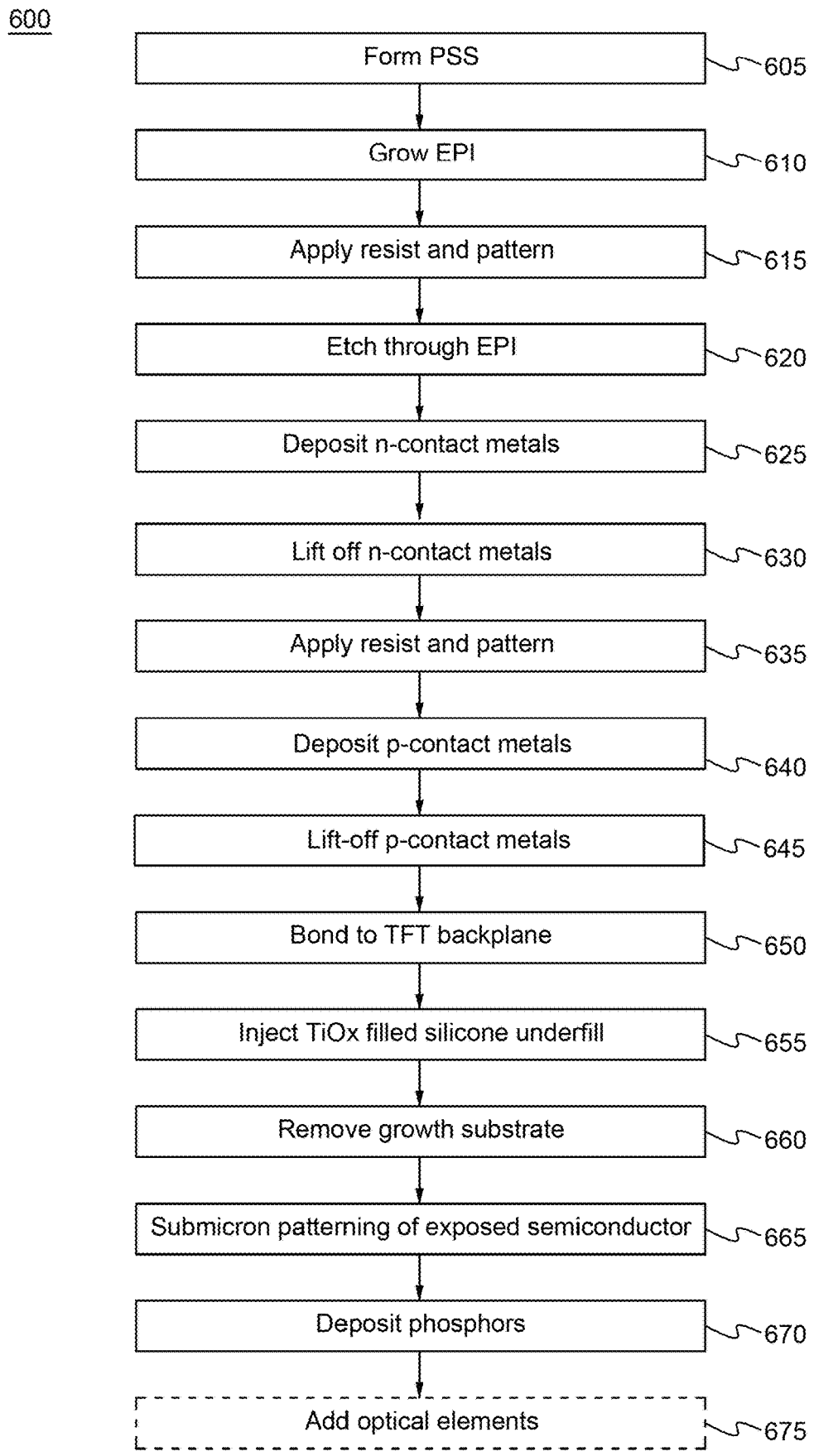
FIG. 6 illustrates a method of producing a monolithic LED array (TFFC)

FIGS. 5A-L (collectively referred to as FIG. 5) illustrate a monolithic LED array (Thin Film Flip Chip (TFFC)) 500 at various stages of the workflow and the accompanying FIG. 6 represents the method 600 of manufacturing a monolithic LED array (TFFC). FIGS. 5 and 6 are discussed in parallel to describe the method of manufacturing of a monolithic LED array (TFFC) and the associated depictions of the monolithic LED array at each stage of the method.

Method 600 includes the formation of a patterned sapphire substrate (PSS) at step 605. As shown in FIG. 5A, PSS 505 may be formed with a pattern (generally shown in FIG. 5A) including height h, width w, street width s, number of steps n and angle Φ to achieve a desired shape as discussed above.

At step 610 of method 600, the epitaxial growth may be formed with a near-UV emission wavelength. As shown n FIG. 5B, the epitaxy may include an n-layer 510, an active layer 515, and a p-layer 520. Each of these layers may be as described with respect to FIG. 4 and may be formed using a technology such as organometallic vapor-phase epitaxy (OMVPE), and/or metalorganic vapor deposition (MOCVD), for example.

At step 615 of method 600, a resist may be applied to the structure. As shown in FIG. 5C, a resist 506 may be applied adjacent to the p-layer 520. Resist 506 may include a pattern in preparation for subsequent steps in method 600.

At step 620 of method 600, the epi layer (including n-layer 510, active layer 515, p-layer 520) may be etched to provide access to substrate 505. The re-contact metals may be applied at step 625. At step 630 of method 600, the n-contact metals may be lifted off to provide the n-contact 530. As shown in FIG. 5D, n-contacts 530 may be electrically coupled to the substrate 505 based on the etching and deposition.

At step 635 of method 600, a subsequent resist layer 508 may be applied onto p-layer 520 surrounding the exposed n-contact 530. Resist layer 508 may be patterned in order to provide for the subsequent placement of a p-contact layer. In FIG. 5E, resist layer 508 is formed to provide an opportunity for the subsequent placement of a p-contact.

At step 640 of method 600, p-contact metals may be deposited. A lift-off deposition of p-contact metals and alloy may be performed at step 645 to form p-contacts 525. As illustrated in FIG. 5F, p-contacts 525 may be placed adjacent to p-layer 520.

At step 650 of method 600, the structure is injection filled with TiOx silicone underfill 512 to fill in areas around n-contact 530, p-contact 525 and p-layer 520. Underfill 512 may be worked back to expose bonding metal of the contacts, p-contact 525 and n-contact 530. As illustrated in FIG. 5G, underfill 512 may form a complete structure. TiOx-silicone underfill 512 provides mechanical strength, chemical protection, optical isolation and reflectivity.

At step 655 and referring to FIG. 5H, the structure may be bonded to the thin film transistor (TFT) backplane 585. TFT backplane 585 may be coupled to p-contact 525 and n-contact 530 to provide the control and electrical connections to the uLED. TFT backplane 585 may be a MOSFET or amorphous Si CMOS, for example.

At step 660 and as depicted in FIG. 5I, the structure may be inverted and the growth substrate 505 may be removed. Once removed, n-layer 510 may be exposed. The structure may include n-layer 510, active layer 515 and p-layer 520, with p-contacts 525 and n-contacts 530 each attached to TFT backplane 585. Although not specifically illustrated in FIG. 5, a submicron patterning of the exposed semiconductor may occur at step 665.

At step 670 and as depicted in FIG. 5J, phosphors 514 may be deposited onto newly exposed n-layer 510 to convert NUV light to the desired color emission. The structure may include phosphors 514, n-layer 510, active layer 515 and p-layer 520, with p-contacts 525 and n-contacts 530 each attached to TFT backplane 585. Phosphors 514 may be selected to produce colors such as blue, green and red, for example.

At step 675 and as depicted in FIG. 5K, optional optical elements 550 may be added to be optically coupled to phosphors 514. These optical elements 550 may be designed to collimate the emission from phosphors 514, for example. Alternatively, optical elements 550 may be used to manipulate the emitted radiation from phosphors 514 in others ways, such as focusing, for example.

For completeness, the bottom of the array of uLEDs is shown in FIG. 5L. The pattern is looking down on FIG. 5I. N-contact 530 is shown. N-contact 530 is adjacent to the flat n-type GaN 515, then the sidewall 512, then the p-layer 520.

No pixel level singulation is required, so the loss in area associated with scribe streets is avoided. A lateral n-contact may be used to maximize the available light emitting area for a given pitch. The contact metal may extend upwards far enough to provide optical isolation and a "pocket" for phosphor deposition. Alternate methods of enhancing reflection may include providing an inorganic reflector on the non-contact areas of the device. Techniques include physical vapor deposition of dielectric and metal coatings, as well as atomic layer deposition of reflector layers. The precise registration of the PSS substrate may enable phosphor deposition techniques. For example, in an embodiment, quantum dot printing techniques, such as intaglio transfer printing may be used. Other techniques such as, but not limited to, screen printing or micro-molding may also be used to enable the claimed uLED device form factors.

The display may be monochrome, built from a single color (ultra-violet, violet, blue, green, red, or infra-red) emitting wafer or a multi-color array built by adding converters such as phosphors and quantum dots to convert the pump light into various color pixels. A combination of direct and PC converted light with three or more colors may be utilized. The size or number of a given color pixel may be adjusted to optimize performance, for example, a large green pixel plus blue and red, or two small green pixels plus blue and red. The present disclosure may remove the requirement of the pick and place process relieving a major source of cost that currently hinders commercialization. It should be noted that the method of FIG. 6 may be modified to fabricate individual red, green, blue uLEDs that are picked and placed in a display device. The n-contact may be made discontinuous to create appropriate scribe streets and the pixels laid out in regular grid. Singulation may occur before step 640 of method 600.

Figure 7A:
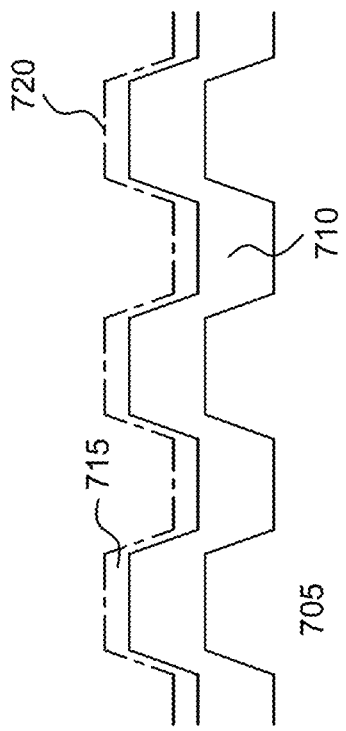
FIGS. 7A-I illustrate a monolithic LED array (VTF) at various stages of the workflow.
Figure 7B:
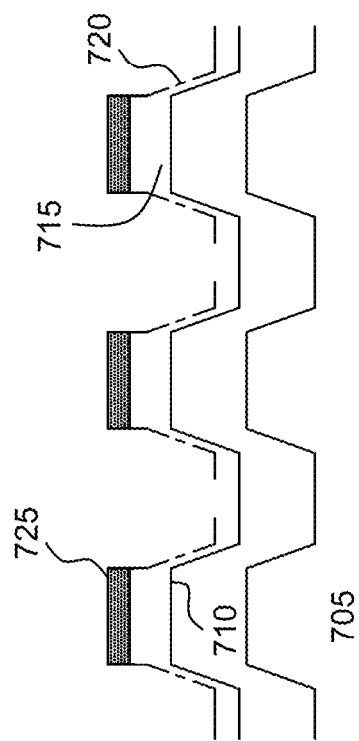
Figure 7C:
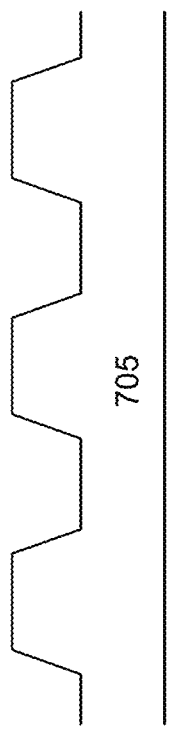
Figure 7D:
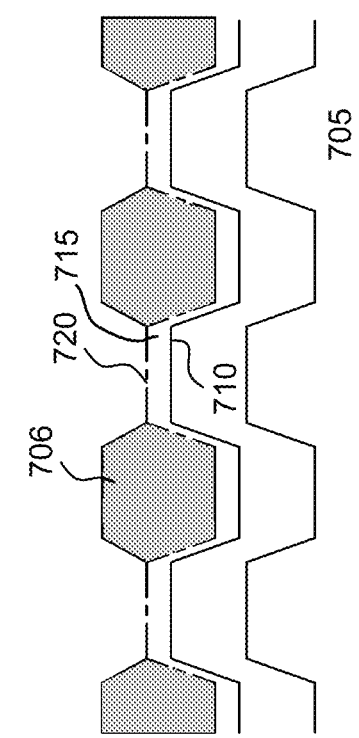
Figure 7E:
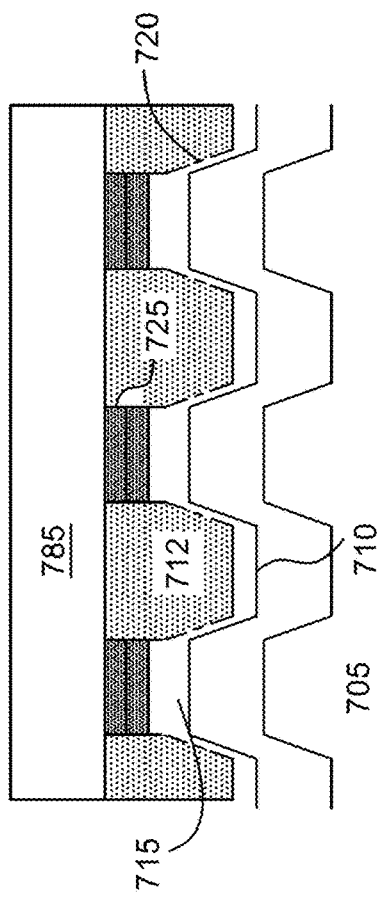
Figure 7F:
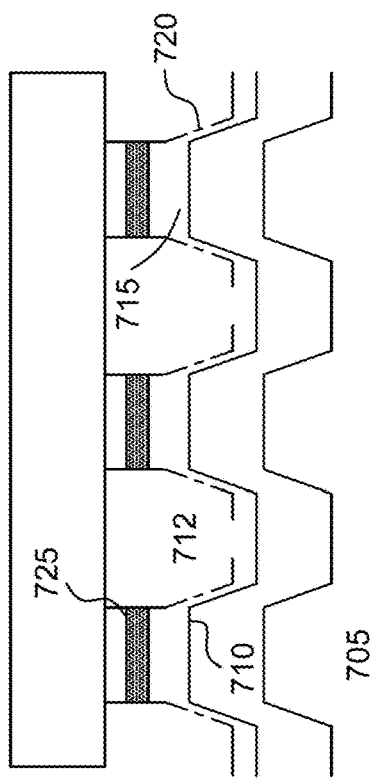
Figure 7G:
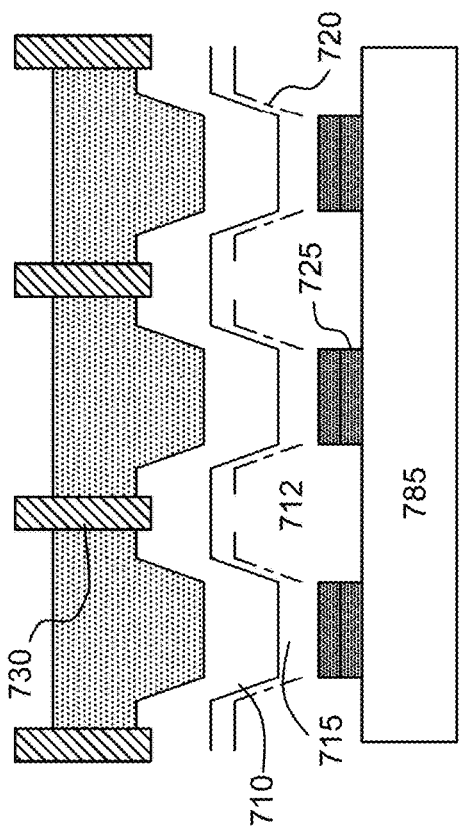
Figure 7H:
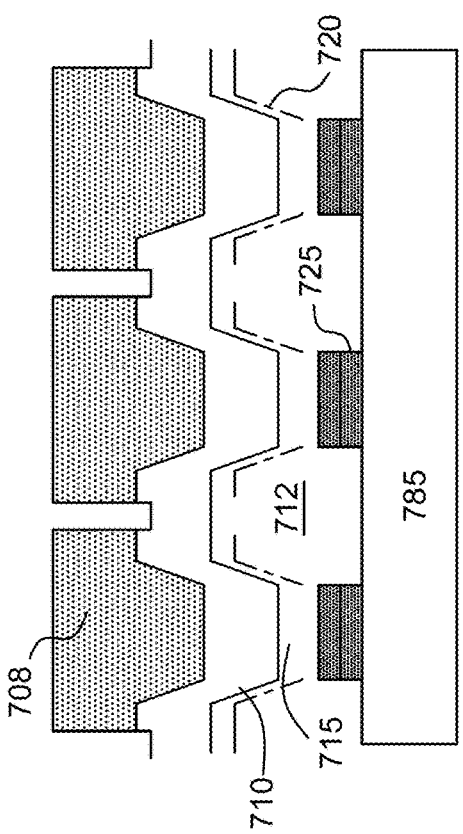
Figure 7I:
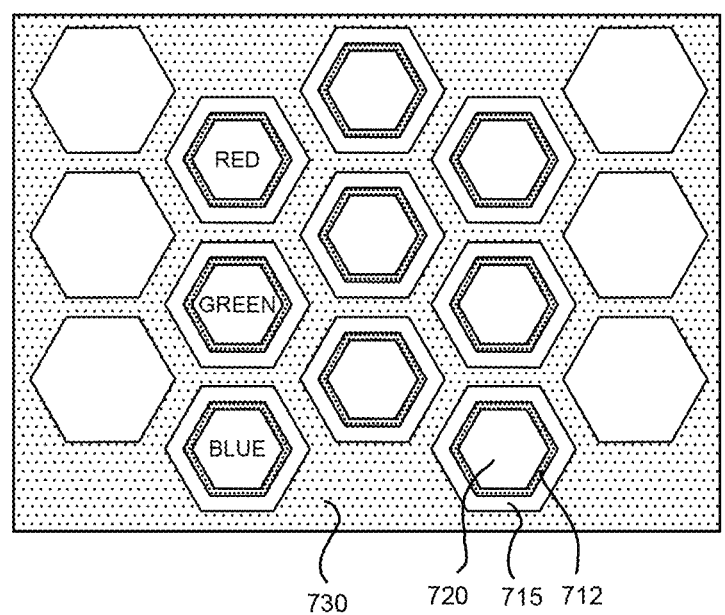
Figure 8:
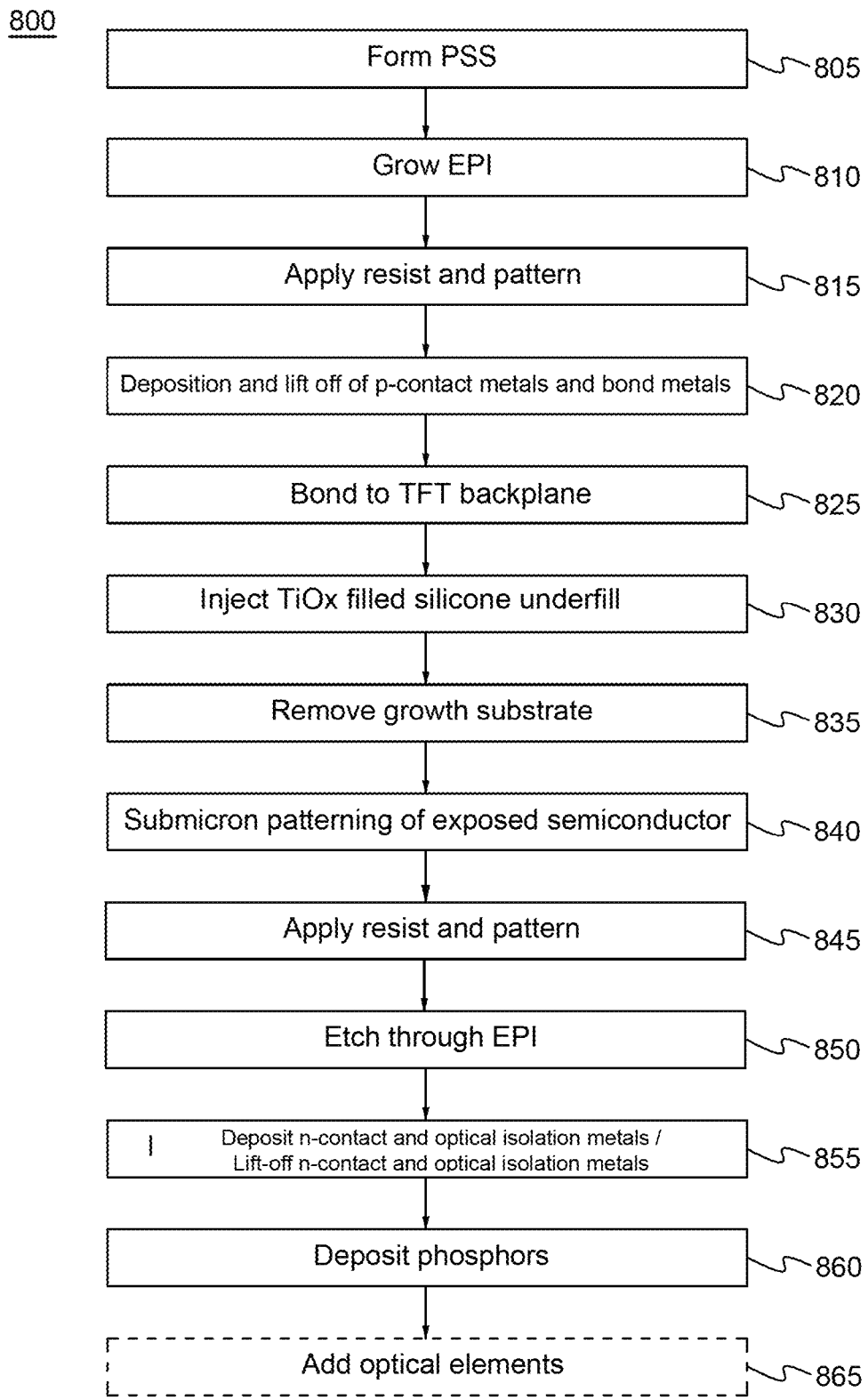
FIG. 8 illustrate a method of producing a monolithic LED array (VTF)

FIGS. 7A-L (collectively referred to as FIG. 7) illustrate a monolithic LED array (Vertical Injection Thin Film (VTF)) 700 at various stages of the workflow and the accompanying FIG. 8 represents the method 800 of manufacturing a monolithic LED array (VTF). FIGS. 7 and 8 are discussed in parallel to describe the method of manufacturing of a monolithic LED array (VTF) and the associated depictions of the monolithic LED array at each stage of the method. FIGS. 7 and 8 illustrate the process workflow and method for a monolithic uLED display using the VTF architecture with n- and p-contacts on opposite sides of the epitaxial layers (phosphor deposition and optional optical element attachment steps not shown).

Method 800 includes the formation of a patterned sapphire substrate (PSS) at step 805. As shown in FIG. 7A, PSS 705 may be formed with a pattern (generally shown in FIG. 8A) including height h, width w, street width s, number of steps n and angle Φ to achieve desired shape as discussed above.

At step 810 of method 800, the epitaxial growth may be formed with a near-UV emission wavelength. As shown n FIG. 7B, the epitaxy may include an n-layer 710, an active layer 715, and a p-layer 720. Each of these layers may be as described with respect to FIG. 4 and may be formed using a technology such as organometallic vapor-phase epitaxy (OMVPE), and/or metalorganic vapor deposition (MOCVD), for example.

At step 815 of method 800, a resist 706 may be applied to the structure. As shown in FIG. 7C, resist 706 may be applied adjacent to the p-layer 720. Resist 706 may include a pattern in preparation for subsequent steps in method 800.

At step 820 of method 800, a deposition and lift-off of p-contact metals and alloy may be performed to form p-contacts 725. As illustrated in FIG. 7D, p-contacts 725 may be placed adjacent to p-layer 720.

At step 825 of method 800, the structure is injection filled with TiOx silicone underfill 712 to fill in areas around p-contact 725 and p-layer 720. Underfill 712 may be worked back to expose bonding metal of p-contact 525. As illustrated in FIG. 7E, underfill 712 may form a complete structure. TiOx-silicone underfill 712 provides mechanical strength, chemical protection, optical isolation and reflectivity.

At step 830 and referring to FIG. 7F, the structure may be bonded to the thin film transistor (TFT) backplane 785. TFT backplane 785 may be coupled to p-contact 725 to provide the control and electrical connections to the uLED. TFT backplane 785 may be a MOSFET or amorphous Si CMOS for example.

At step 835 and as depicted in FIG. 7G, the structure may be inverted and the growth substrate 705 may be removed. Once removed, n-layer 710 may be exposed. The structure may include n-layer 710, active layer 715 and p-layer 720, with p-contacts 725 attached to TFT backplane 785. Although not shown in FIG. 7, step 840 may include submicron patterning of the exposed semiconductor.

At step 845 of method 800, a resist 708 may be applied to the structure. As shown in FIG. 7G, resist 708 may be applied adjacent to the n-layer 710. Resist 708 may include a pattern in preparation for subsequent steps in method 800.

At step 850 of method 800, the epitaxial layer is etched to the contact layer. At step 845 of method 800, a metal stack may then be deposited to provide the n-contact 730. As shown in FIG. 7H, n-contacts 730 may be electrically coupled to n-layer 710 based on the etching and deposition. Although not shown in FIG. 7, step 855 includes depositing n-contact and optical isolation materials.

At step 860 of method 800, phosphors (not shown—see FIG. 5) may be deposited onto the exposed n-layer to convert NUV light to the desired color emission. Phosphors 514 may be selected to produce colors such as blue, green and red, for example.

At step 865 of method 800, optional optical elements (not shown—see FIG. 5) may be added to be optically coupled to phosphors. These optical elements may be designed to collimate the emission from phosphors, for example. Alternatively, optic elements may be used to manipulate the emitted radiation from phosphors in others ways, such as focusing, for example.

For completeness, the top of the array of uLEDs is shown in FIG. 7I. The pattern is looking down on FIG. 7H. N-contact 730 is shown. N-contact 730 is adjacent to the flat n-type GaN 715, then the underfill 712, then the p-layer 720.

All the capabilities described above for the flip chip version of the monolithic array are applicable to the VTF version, with the exception of the fabrication of individual elements. Individual VTF emitters are unlikely to be competitive with flip-chip elements.

Both methods 600 and 800 are compatible with standard TFT backplanes to enable compatibility with existing systems. Methods 600 and 800 offer the potential for a flexible display if mated to a flexible backplane. Optical isolation between pixels of both pump and converted light is excellent. Coupling of optical elements may be done in an efficient parallel fashion with, for example, over-molding.

The various embodiments are depicted in the non-exclusive illustrations of FIGS. 9-22.

Figure 9:
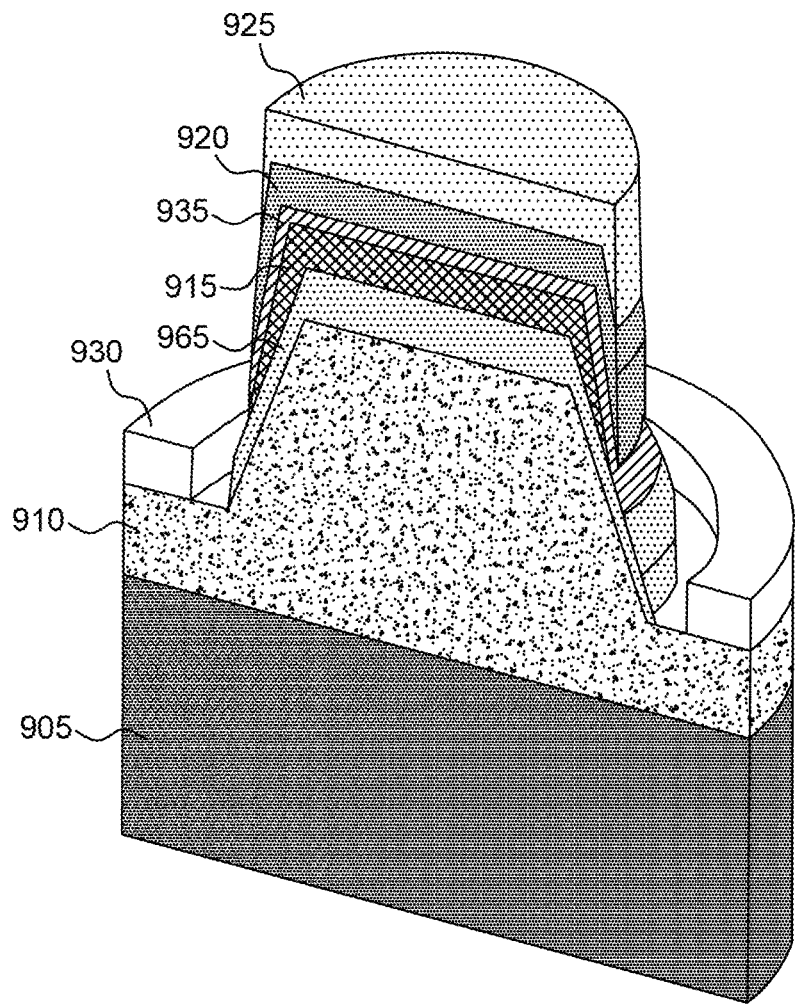
FIG. 9 illustrates a uLED by regrowth on patterned n-layer (not limited to depicted circular cross-section)

FIG. 9 illustrates a uLED 900 created by regrowth on a patterned p-layer 910. While uLED 900 includes a circular cross-section uLEDs may be configured based on uLED 900 with other cross sections also. uLED 900 includes a layered device including layers of a substrate 905, n-layer 910, n-layer regrowth 965, active layer 915, electron blocking layer (EBL) 935, p-layer 920, and p-contact 925. EBL 935 may provide electron blocking as would be understood in the art and/or may provide a set-back in the geometry of the configuration. N-contact 930 may be provided around the layered device and may extend as high or low on the device structure as needed to provide the necessary electrical connections. uLED 900 may be formed via method 600. uLED 900 is depicted before removal of the substrate 905 in method 600.

Figure 10:
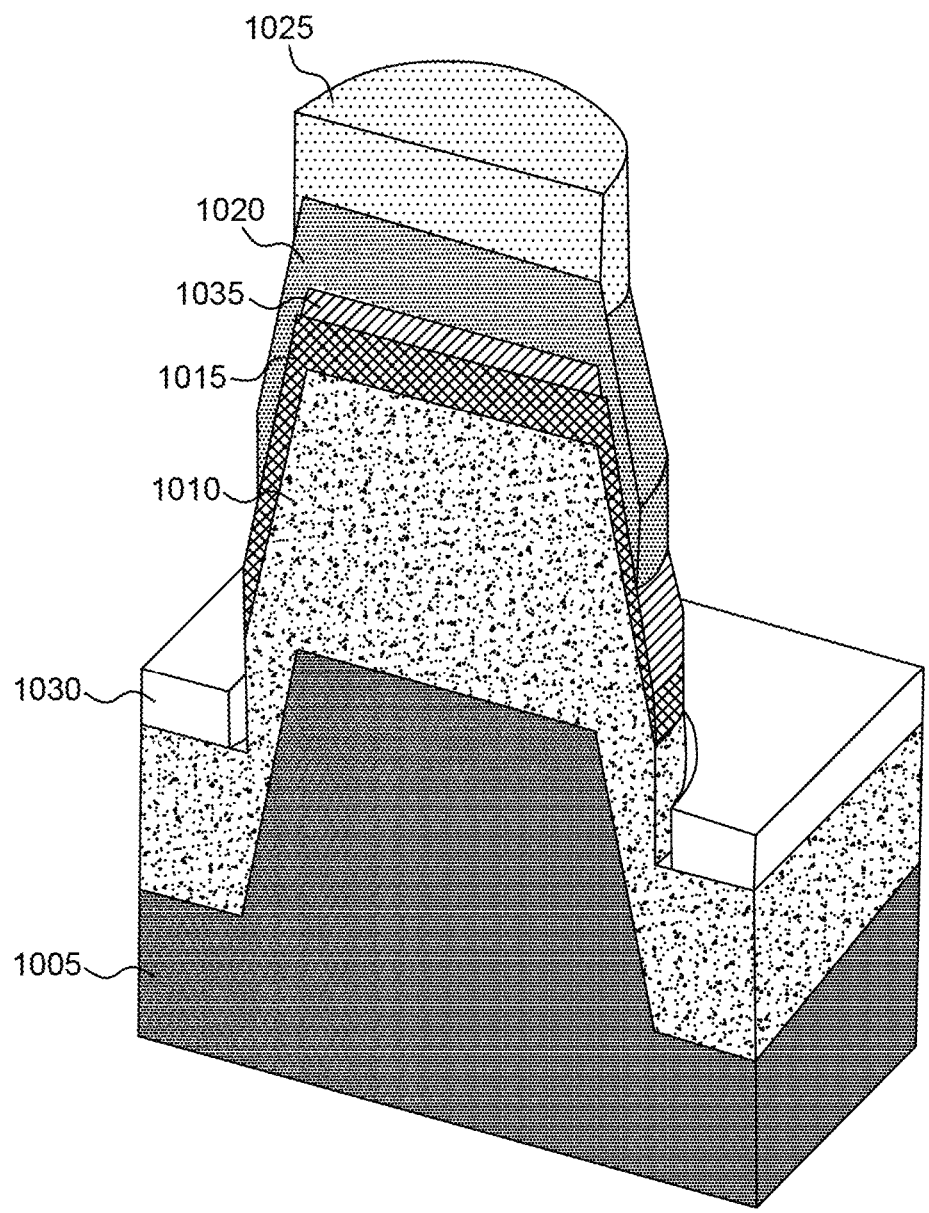
FIG. 10 illustrates a uLED structure on patterned substrates (not limited to depicted circular cross-section)

FIG. 10 illustrates a uLED 1000 created on a patterned substrate 1005. While uLED 1000 includes a circular cross-section, uLEDs may be configured based on uLED 1000 with other cross sections. uLED 1000 includes a layered device including layers of a substrate 1005, n-layer 1010, active layer 1015, EBL 1035, p-layer 1020, and p-contact 1025. EBL 1035 may provide electron blocking as would be understood in the art and/or may provide a set-back in the geometry of the configuration. N-contact 1030 may be provided around the layered device and may extend as high or low on the device structure as needed to provide the necessary electrical connections. uLED 1000 may be formed via method 600. uLED 1000 is depicted before removal of the substrate 1005 in method 600.

Figure 11B:
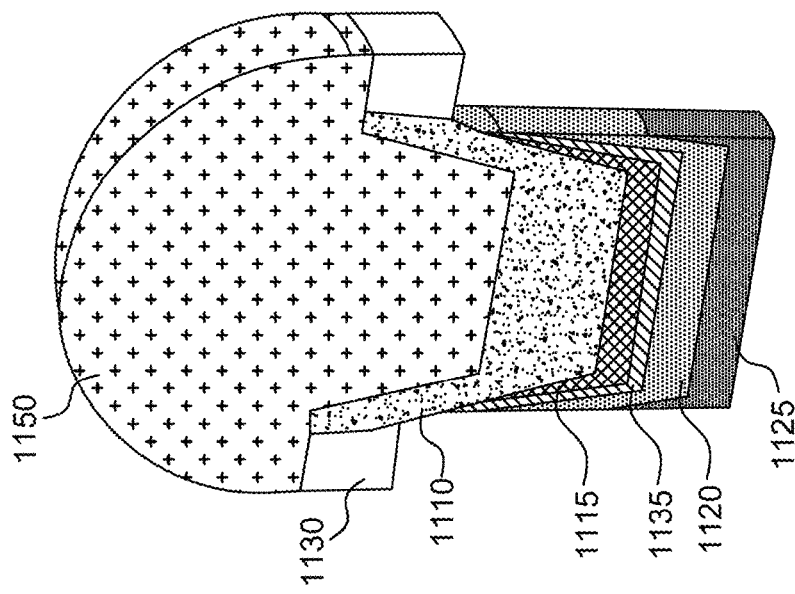
FIGS. 11A and B illustrate TFFC versions of uLEDs with attached lens.
Figure 11A:
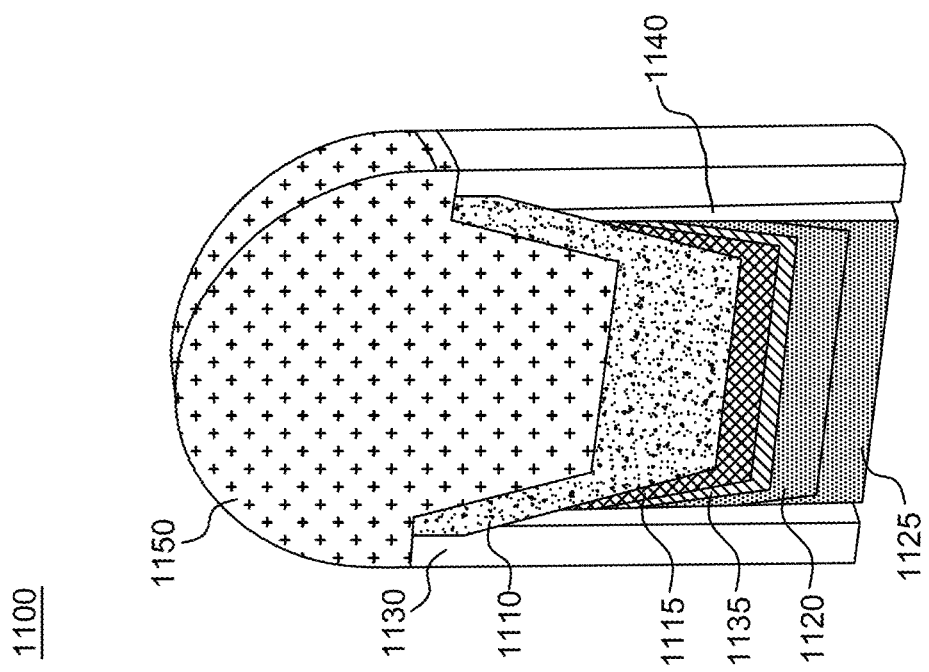

FIGS. 11A and B illustrate TFFC versions of uLEDs 1100 with an attached lens. uLEDS 1100 may be formed from method 600. uLED 1100 depicts an LED further in the process from that of FIG. 10 with the epi structure flipped over and the substrate removed as described above. uLED 1100 includes a p-contact 1125 positioned adjacent to a p-layer 1120. P-layer 1120 is located adjacent to EBL 1135, which is adjacent to active layer 1115. N-layer 1110 is positioned adjacent to active layer 1115 distal to EBL 1135. N-contact 1130 is coupled to p-layer 1110. In between the epitaxial layers and n-contact 1130 is a dielectric insulator 1140. Dielectric insulator 1140 between n-layer 1110 and p-layer 1120 does not need to passivate active layer 1115. Dielectric insulator 1140 may operate as an insulator and therefore may be cheaper and simpler to implement. Adjacent to the n-layer 1110 is a micro-molded lens 1150. FIG. 11A depicts uLED 1100 with the n-contact 1130 and dielectric insulator 1140 extending approximately even with the p-contact 1125. FIG. 11B has the dielectric insulator 1140 removed while n-contact 1130 extends slightly beyond n-layer 1110.

Figure 12B:
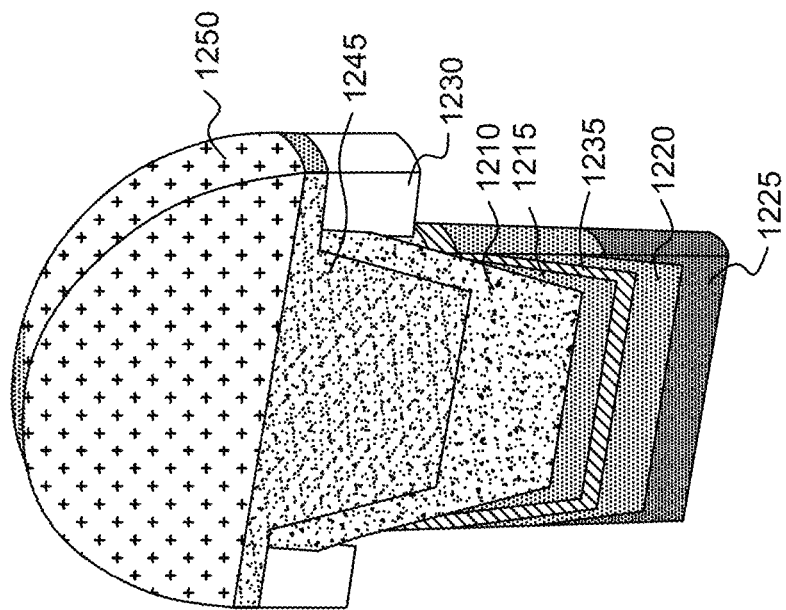
FIGS. 12A and B illustrate CSP versions of uLEDs with attached lens.
Figure 12A:
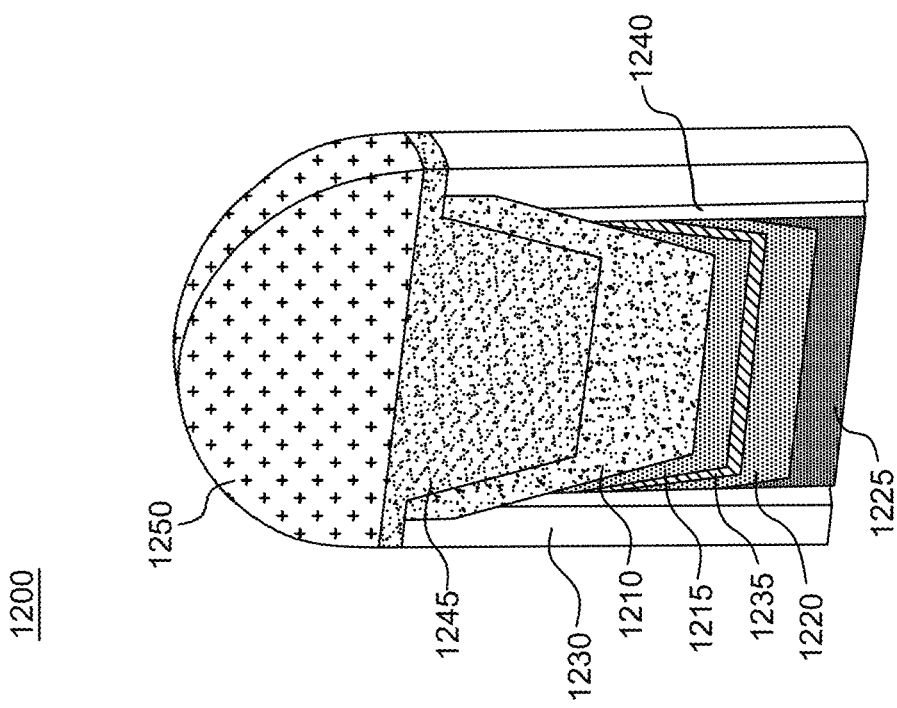

FIGS. 12A and B illustrate chip scale package (CSP) versions of uLEDs 1200 with the attached lens. uLEDS 1200 may be formed from method 600. uLED 1200 depicts a LED further in the process from that of FIG. 10 with the epi structure flipped over and the substrate removed as described above. uLED 1200 includes a p-contact 1225 positioned adjacent to a p-layer 1220. P-layer 1220 is located adjacent to EBL 1235, which is adjacent to active layer 1215. N-layer 1210 is positioned adjacent to active layer 1215 distal to EBL 1235. N-contact 1230 is coupled to n-layer 12110. In between the epitaxial layers and n-contact 1230 is a dielectric insulator 1240. Dielectric insulator 1240 between n-layer 1210 and p-layer 1220 does not need to passivate active layer 1215. Dielectric insulator 1240 may operate as an insulator and therefore may be cheaper and simpler to implement. Adjacent to the n-layer 1210 is a transparent substrate 1245 with a micro molded lens 1250 adjacent to transparent substrate 1245 distal to n-layer 1210. Transparent substrate 1245 may be thinned as would be understood to those possessing an ordinary skill in the art. FIG. 12A depicts uLED 1200 with the re-contact 1230 and dielectric insulator 1240 extending approximately even with the p-contact 1225. FIG. 12B has the dielectric insulator 1240 removed while n-contact 1230 extends slightly beyond n-layer 1210.

Figure 13:
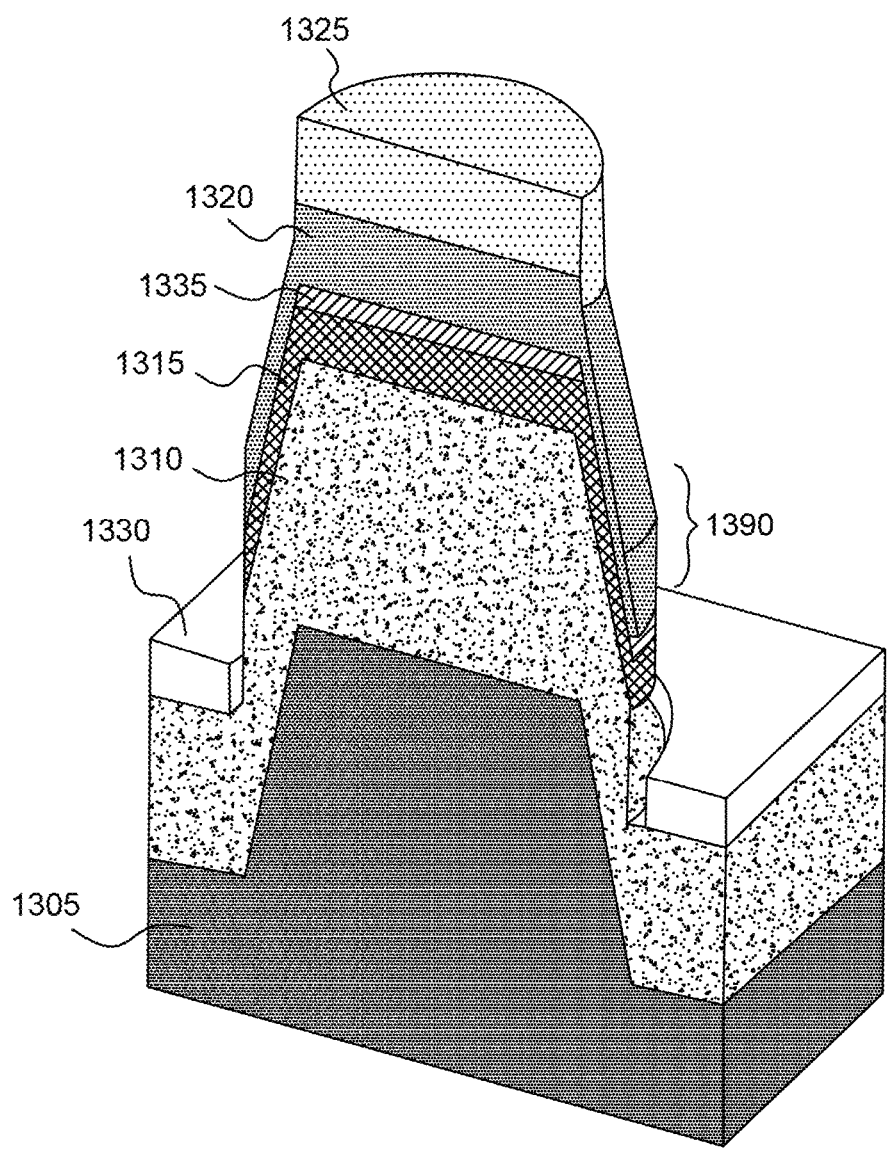
FIG. 13 illustrates an alternative uLED embodiment requiring less processing (p-side sidewall)

FIG. 13 illustrates an alternative uLED 1300 embodiment requiring less processing (p-side sidewall). Similar to uLED 1000 of FIG. 10, uLED 1300 includes a layered device including layers of a substrate 1305, n-layer 1310, active layer 1315, EBL 1335, p-layer 1320, and p-contact 1325. N-contact 1330 may be provided around the layered device and may extend as high or low on the device structure as needed to provide the necessary electrical connections. uLED 1300 may be formed via method 600. uLED 1300 is depicted before removal of the substrate 1305 in method 600. uLED 1300 differs from uLED 1000 in that in the process of making uLED 1300 there was no additional etch performed on p-side as p-layer 1320 is thin to adequately reduce hole transport to active layer 1315. As a result p-layer 1320 extends down the outer epitaxial layers highlighted by element 1390.

Figure 14B:
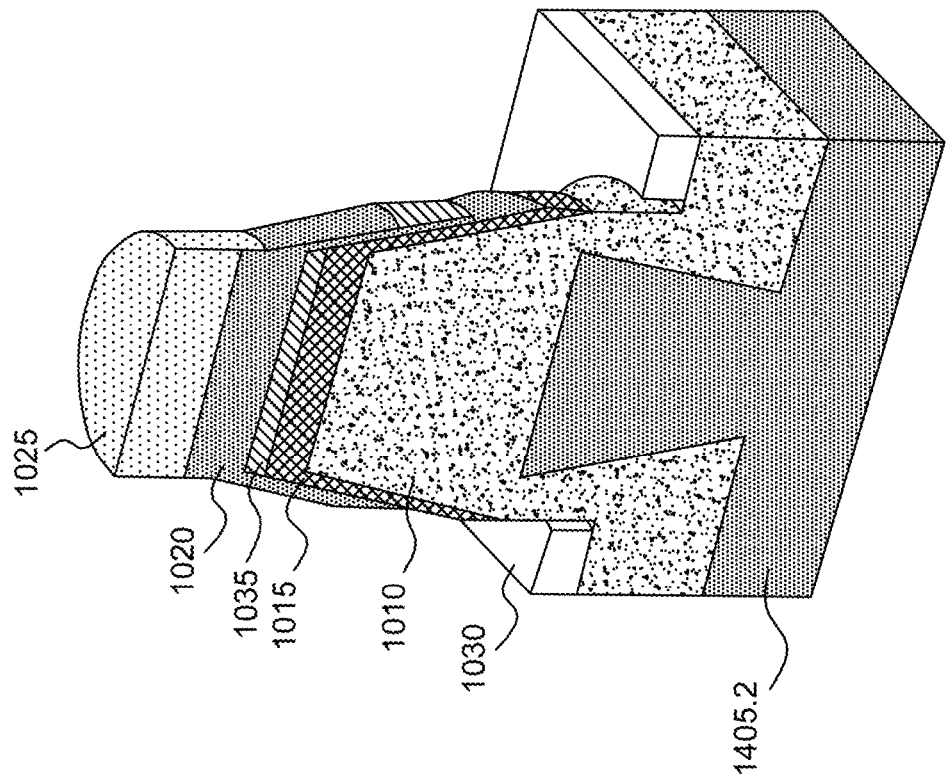
FIGS. 14A and B illustrate alternative embodiments for substrate (shown) or template pattern angle.
Figure 14A:
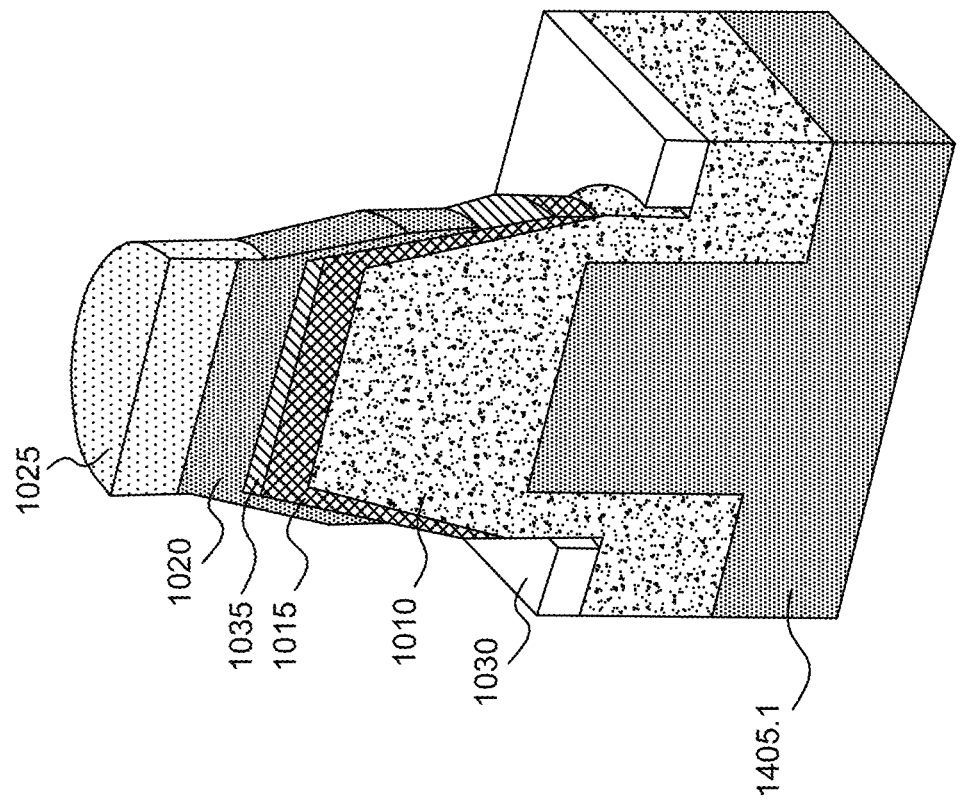

FIG. 14A and FIG. 14B illustrate alternative embodiments for the template pattern of the substrate (shown) or template pattern angle generally. FIG. 14A and FIG. 14B depict the uLED 1000 of FIG. 10. uLED 1000 includes a layered device including layers of a substrate 1405, n-layer 1010, active layer 1015, EBL 1035, p-layer 1020, and p-contact 1025. N-contact 1030 may be provided around the layered device and may extend as high or low on the device structure as needed to provide the necessary electrical connections. As depicted illustrated in FIG. 14A, substrate 1405 is formed as substrate 1405.1. Substrate 1405.1 includes vertical sides that may be beneficial in certain growth conditions. As illustrated specifically in FIG. 14B, substrate 1405 is formed as substrate 1405.2. Substrate 1405.2 includes an inverted side-cut that may be beneficial in certain growth conditions.

Figure 15C:
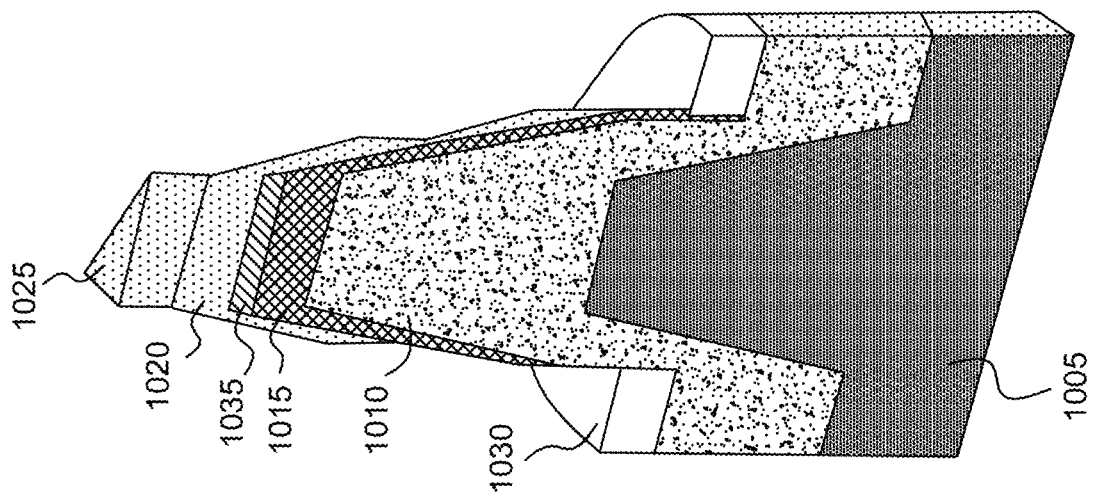
FIGS. 15A-C illustrate embodiments for different cross-sections of substrate (shown) or template patterns (for example, rectangular, triangular, polygonal)
Figure 15B:
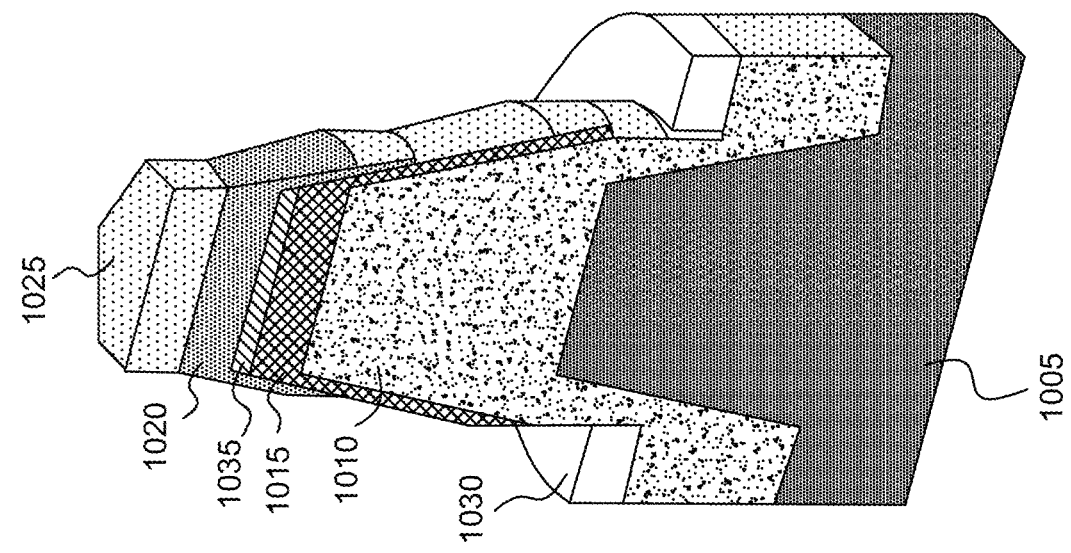
Figure 15A:
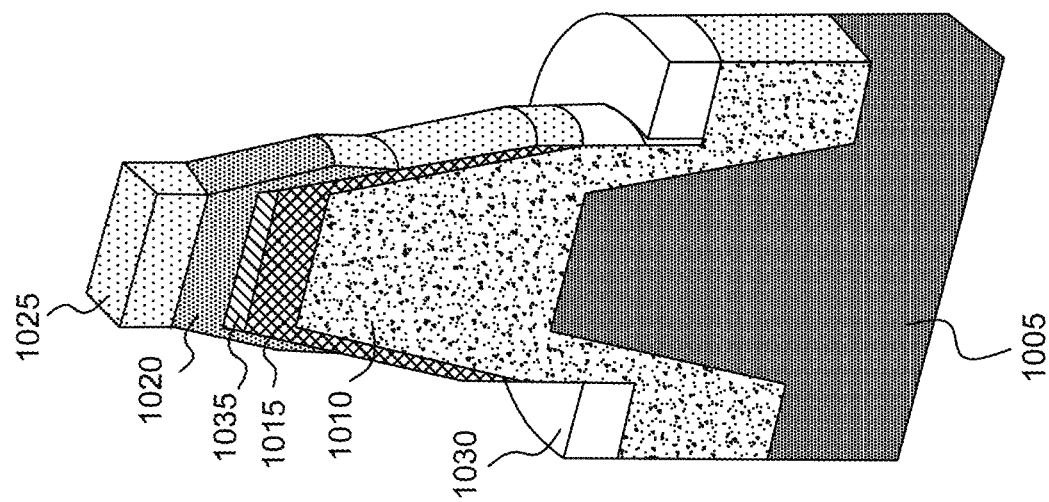

FIGS. 15A-C illustrate embodiments for different cross-sections of substrate (shown) or template patterns generally. FIGS. 15A-C depict the uLED 1000 of FIG. 10. uLED 1000 includes a layered device including layers of a substrate 1005, n-layer 1010, active layer 1015, EBL 1035, p-layer 1020, and p-contact 1025. EBL 1035 may provide electron blocking as would be understood in the art and/or may provide a set-back in the geometry of the configuration. N-contact 1030 may be provided around the layered device and may extend as high or low on the device structure as needed to provide the necessary electrical connections. The uLED of FIG. 15A is illustrated as a rectangular pattern. The uLED of FIG. 15B is illustrated as a polygonal pattern. The uLED of FIG. 15C is illustrated as a triangular pattern. Other shaped patterns may also be created.

Figure 16:
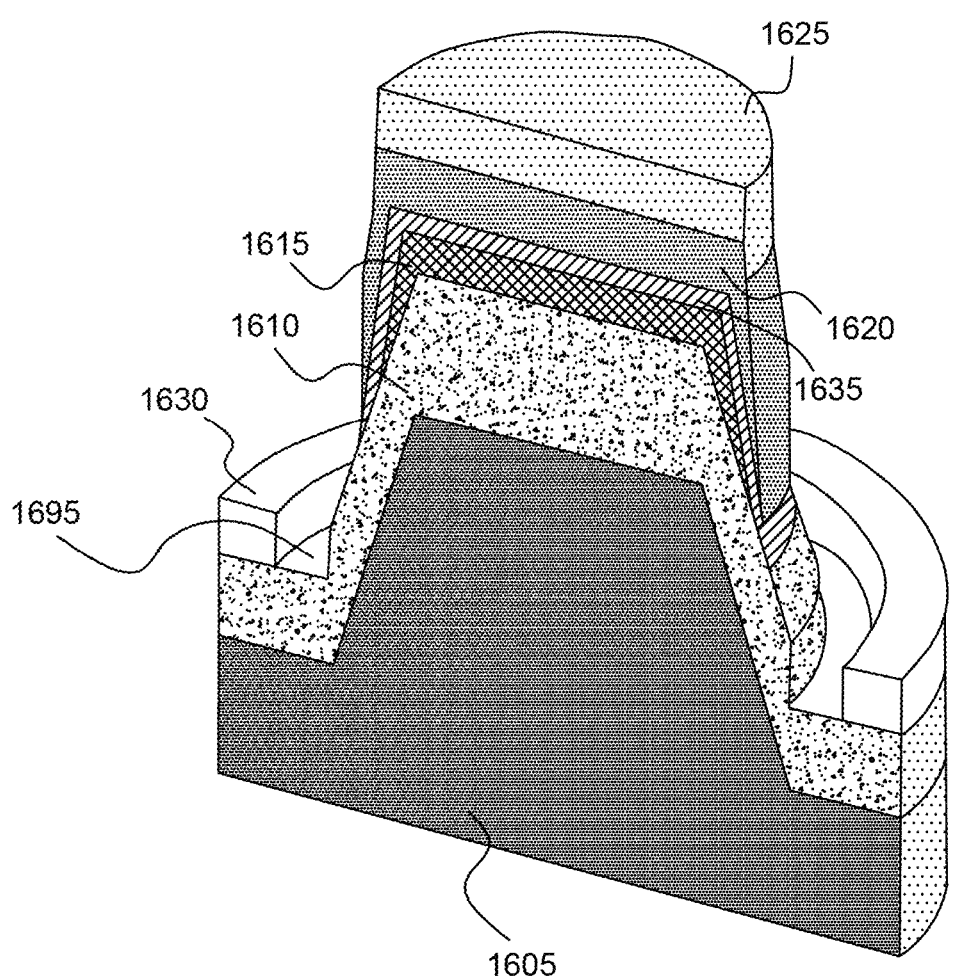
FIG. 16 illustrates an embodiment of uLED with isolated active region via "pinch-off"

FIG. 16 illustrates an embodiment of uLED 1600 with isolated active region via "pinch-off". Similar to uLED 1000 of FIG. 10, uLED 1600 includes a layered device including layers of a substrate 1605, n-layer 1610, active layer 1615, EBL 1635, p-layer 1620, and p-contact 1625. N-contact 1630 may be provided around the layered device and may extend as high or low on the device structure as needed to provide the necessary electrical connections. uLED 1600 may be formed via method 600. uLED 1600 is depicted before removal of the substrate 1605 in method 600. uLED 1600 includes a realization of pinch-off that implies epitaxial growth optimization and is highlighted by element 1695.

Figure 17:
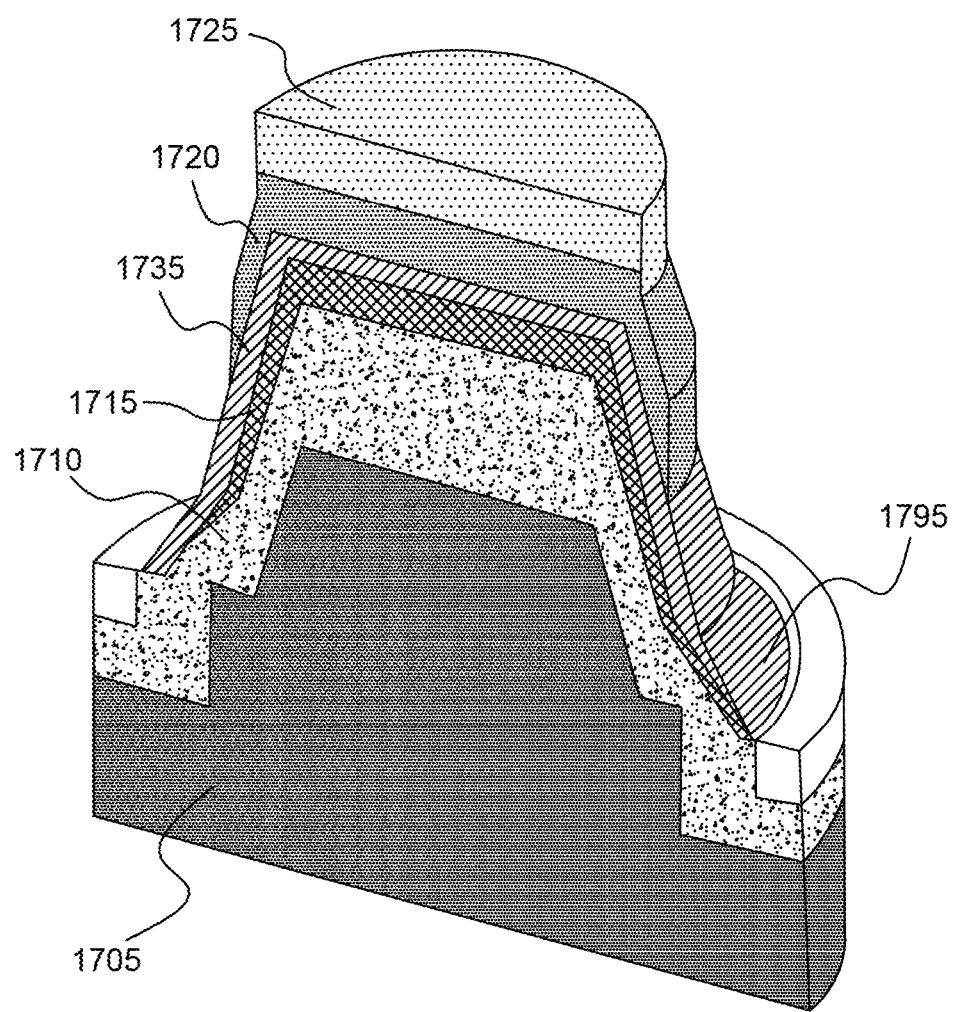
FIG. 17 illustrates a uLED on multilevel patterned substrates.

FIG. 17 illustrates a uLED 1700 on a multilevel patterned substrate. Similar to uLED 1000 of FIG. 10, uLED 1700 includes a layered device including layers of a substrate 1705, n-layer 1710, active layer 1715, EBL 1735, p-layer 1720, and p-contact 1725. N-contact 1730 may be provided around the layered device and may extend as high or low on the device structure as needed to provide the necessary electrical connections. uLED 1700 may be formed via method 600. uLED 1700 is depicted before removal of the substrate 1705 in method 600. uLED 1700 includes an active layer 1715 that does not necessarily include pinch-off highlighted by element 1795. uLED 1700 may be realized using self-align features.

Figure 18:
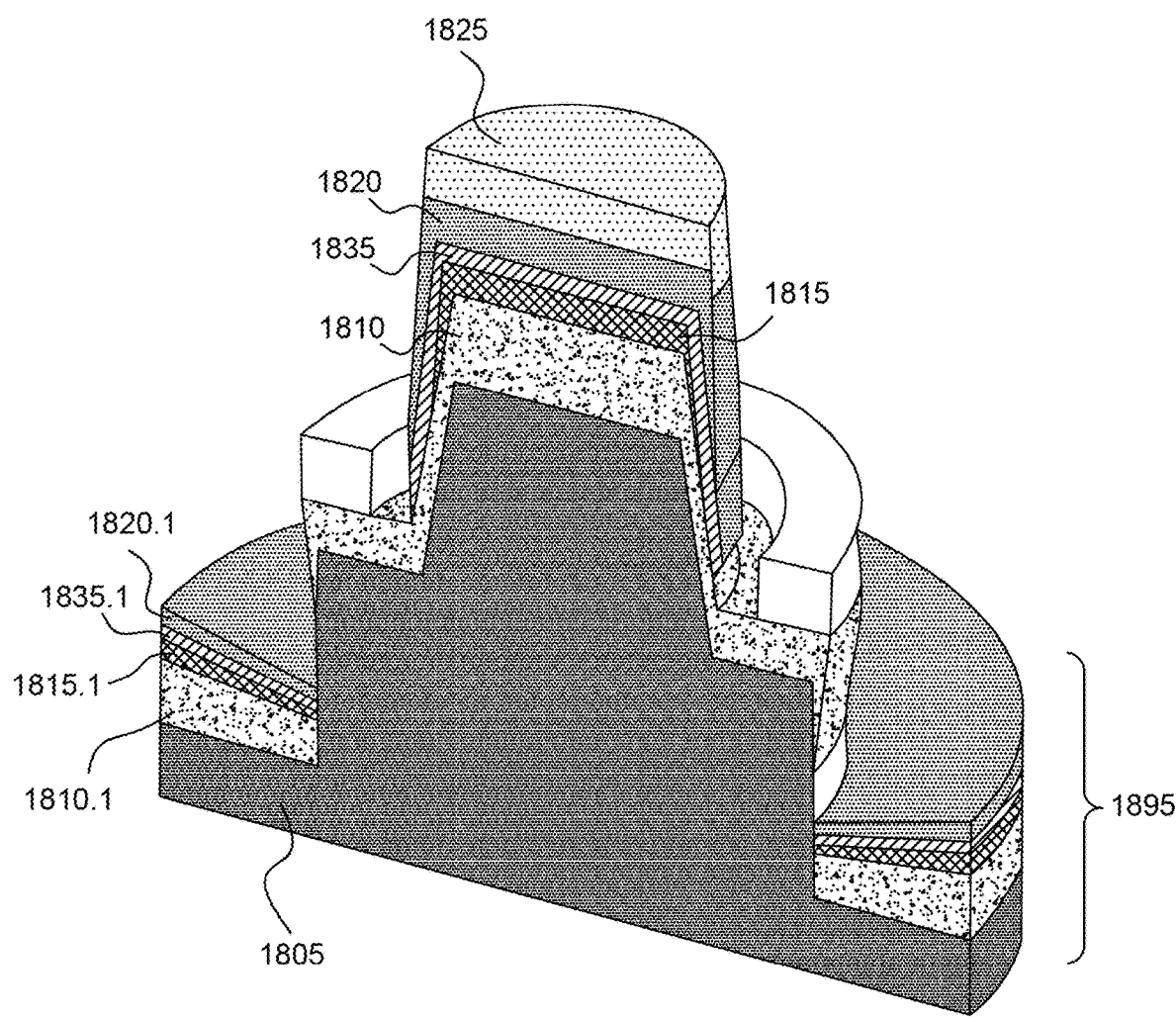
FIG. 18 illustrates an isolated uLED realized through use of via multilevel patterned substrate.

FIG. 18 illustrates an isolated uLED 1800 realized through a via multilevel patterned substrate. Similar to uLED 1000 of FIG. 10, uLED 1800 includes a layered device including layers of a substrate 1805, n-layer 1810, active layer 1815, EBL 1835, p-layer 1820, and p-contact 1825. N-contact 1830 may be provided around the layered device and may extend as high or low on the device structure as needed to provide the necessary electrical connections. uLED 1800 may be formed via method 600. uLED 18700 is depicted before removal of the substrate 1805 in method 600. uLED 1700 may be realized using a multi-step pattern of substrate 1805. This multi-step substrate is described above with respect to FIG. 2B. uLED 1800 as depicted has no processing beyond the inner uLED. As a result, an additional epitaxial layer 1895 including a substrate 1805, another growth of n-layer 1810.1, another growth of active layer 1815.1, another growth of EBL 1835.1, and another growth of p-layer 1820.1 is formed. This design allows the deposition of fully isolated uLEDs 1820.1 and the layers below may be ignored and removed, simplifying the wafer fabrication.

FIGS. 19A and B illustrate a monolithic TFFC array 1900 of uLEDs 2000 using phosphor conversion and optical isolation that does not require pick and place. As is illustrated in FIG. 19A, a view from the lens side of array 1900 is provided. As is illustrated in FIG. 19B, a view from the distal to the lens side of array 1900 is provided. Array 1900 is illustrated as an array of uLEDs that is 4×4 with the fourth row being depicted as cut in half so that the internals of each uLED 2000 may be viewed. The specifics of each uLED are provided in and described with respect to FIG. 20. In FIGS. 19A and B there is a column on each end of red uLEDs 1901 of uLED 2000. In between the two red columns is a column of green uLEDs 1902 of uLED 2000 and a column of blue uLEDs 1903 of uLED 2000. Such a configuration enables RGB as understood in the art.

Figure 20:
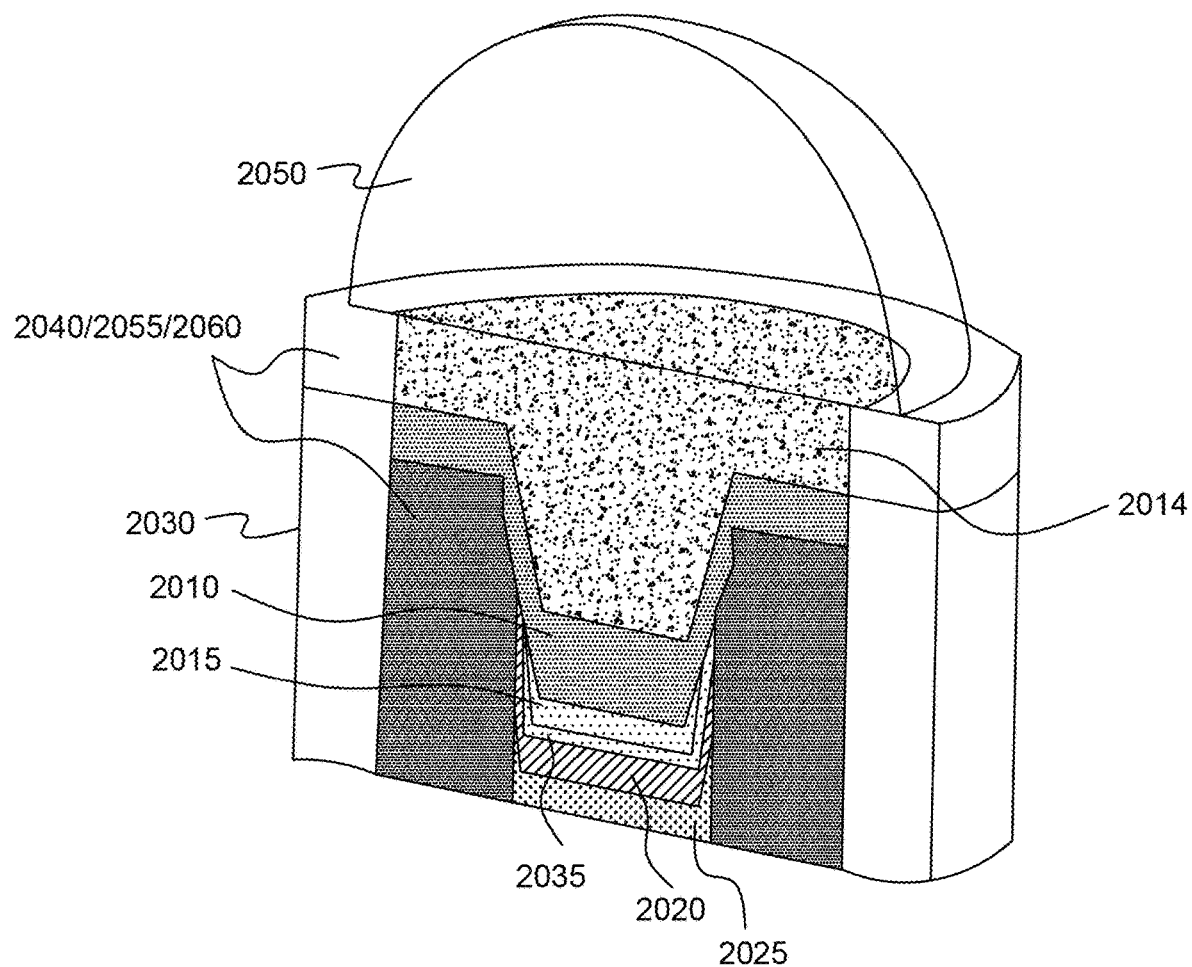
FIG. 20 illustrates a uLED unit cell of monolithic TFFC array using phosphor conversion and optical isolation.

FIG. 20 illustrates a uLED 2000 unit cell of monolithic TFFC array using phosphor conversion and optical isolation. uLED 2000 may be formed from method 600. uLED 2000 depicts a LED similar to that of FIG. 12. uLED 2000 includes a p-contact 2025 positioned adjacent to a p-layer 2020. P-layer 2020 is located adjacent to EBL 2035, which is adjacent to active layer 2015. N-layer 2010 is positioned adjacent to active layer 2015 distal to EBL 2035. N-contact 2030 is coupled to n-layer 2010. Phosphor layer 2014 is included adjacent to n-layer 2010. In between the epitaxial layers and n-contact 2030, and surrounding any exposed regions of phosphor layer 2014 is a dielectric insulator 2040/optical isolator 2055/stiffener 2060. Adjacent to the n-phosphor layer 2014 is a micro molded lens 2050 distal to n-layer 1210. Dielectric insulator 2040/optical isolator 2055/stiffener 2060 may be three separate layers or may be a single layer that performs the function of a dielectric insulator, an optical insulator and a stiffener.

Figure 22:
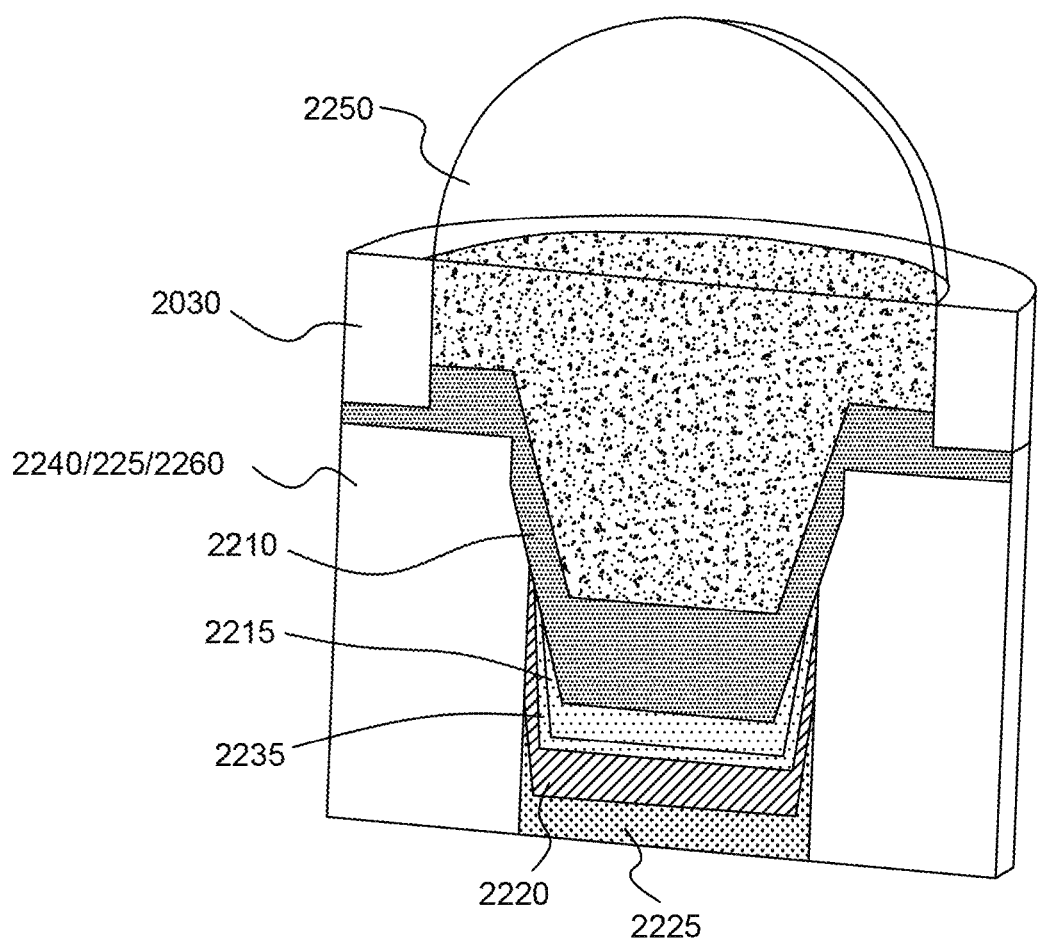
FIG. 22 illustrates a uLED unit cell of monolithic VTF array using phosphor conversion and optical isolation.

FIGS. 21A and B illustrates a monolithic VTF array 2100 of uLEDs 2200 in FIG. 22 using phosphor conversion and optical isolation that does not require pick and place. As is illustrated in FIG. 21A, a view from the lens side of array 2100 is provided. As is illustrated in FIG. 21B, a view from the distal side of array 2100 is provided. Array 2100 is illustrated as an array of uLEDs that is 5×4 with the fourth row being depicted as cut in half so that the internals of each uLED 2000 may be viewed. In array 2100 each column is offset from its neighbor so as to misalign the uLEDs 2200 in adjacent columns from each other. For example, columns 2101, 2013 and 2105 are aligned, while columns 2102 and 2104 are offset approximately on half width of the uLED 2200 (accounting for the spacing between uLEDs 2200). The specifics of each uLED are provided in and described with respect to FIG. 22. In FIGS. 21A and B, the odd columns 2101, 2103 and 2105 alternate between green uLEDs 2200 and red uLEDs 2200. The even columns 2102 and 2104 alternate between green uLEDs 2200 and blue uLEDs 2200. Such a configuration enables RGB as understood in the art.

FIG. 22 illustrates a uLED 2200 unit cell of monolithic VTF array using phosphor conversion and optical isolation. Similar conceptually to uLED 2000 of FIG. 20, uLED 2000 may be formed from method 800. uLED 2200 includes a p-contact 2225 positioned adjacent to a p-layer 2220. P-layer 2220 is located adjacent to EBL 2235, which is adjacent to active layer 2215. N-layer 2210 is positioned adjacent to active layer 2215 distal to EBL 2235. N-contact 2230 is coupled to n-layer 2210 while being positioned separated from the other layers as described above with respect to FIGS. 7 and 8. Phosphor layer 2214 is included adjacent to n-layer 2210. The epitaxial layers are surrounded by a dielectric insulator 2240/optical isolator 2255/stiffener 2260. Adjacent to the n-phosphor layer 2214 is a micro molded lens 2250 distal to n-layer 2210. Dielectric insulator 2240/optical isolator 2255/stiffener 2260 may be three separate layers or may be a single layer that performs the function of a dielectric insulator, an optical insulator and a stiffener.

The present embodiments and concepts with suitable modifications may be applied to a range of light emitting material including both (Al)InGaN (Aluminum, Indium, Gallium, Nitride) and AlInGaP (Aluminum, Indium, Gallium, Phosphide) LEDs.

The singulated die embodiments may be used for all types of uLEDs applications, including a wide range of display sizes and moderate to low pixel density, including, for example, large area monitors and billboards and cellphones. The compact monolithic design is suitable for small high density, high performance arrays such as watches, projectors and Virtual/Mixed/Augmented Reality devices. Optics may be added to control emission pattern with >3 colors generated for custom displays. Flexible, curved displays are compatible with the teachings herein. White emitting phosphor mixtures may be used for illumination applications addressing various pixel combinations to tune color temperature and radiation pattern through system optics. The intensity of some or all pixels may be varied in time to trigger external events or transmit information. Some pixels may be used as detectors while some are used as emitters. Optical patterns may be synchronized to external sound frequencies for entertainment or to convert sound to an equivalent light pattern. A touchscreen may be included in the display construction and pressure signals may be coupled to light patterns. Two color rear automotive lighting may be provided, e.g., the color may become a deeper red and brighter as brakes are more heavily applied. Generally, a color shift may be used to transmit information such as external weather conditions, temperature, etc. Automotive forward lighting units with controllable source patterns may be formed. Finally, the devices created are scalable, limited only by the size and shape of the growth substrate.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be mask works that are then used in a semiconductor manufacturing process to manufacture a processor which implements features of the disclosure.

The methods or flow charts provided herein may be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A micrometer scale light emitting diode (uLED) comprising:
    a growth substrate comprising flat first and second regions, where the growth substrate is thicker in the first region as compared to the second region, and a third region of sloped sidewalls connecting the first and second regions, the topography forming a regular geometric pattern;
    a plurality of semiconductor epitaxial layers covering the first, second, and third regions comprising: at least a p-n junction layer including a light emitting active region of direct bandgap semiconductor, sandwiched between n-type and p-type layers, wherein of the plurality of semiconductor epitaxial layers is thicker on the first and second regions as compared to the corresponding semiconductor epitaxial layers on the third region;
    an n-contact on the n-layer and a p-contact on the p-layer; and
    at least one layer of light converting phosphor.

2. The uLED of claim 1, wherein the thinner epitaxial layers on the sidewall enables a high resistance to hole current between the n-contact and the p-contact, confining greater than 90% of forward bias hole injection to the first region.

3. The uLED of claim 2, wherein the high resistance is greater than 800 ohm/square.

4. The uLED of claim 1, wherein a perimeter of the first region forms a regular polygon having a number of sides greater than 3 and pitch less than 150 micrometers, a nd the angle between the first region and third region is between 95 and 120 degrees.

5. The uLED of claim 1, wherein the surfaces distal to the n-contact and the p-contact are within 1 micrometer of the same height.

6. The uLED of claim 1 further comprising a supporting underfill.

7. The uLED of claim 1 further being coupled to a thin film transistor (TFT) backplane chip.

8. The uLED of claim 1, further including an optics to control emission angle of light.

9. The uLED of claim 1 further including a ridge of reflecting material to form a barrier to contain the phosphor and reflect light back into the phosphor to thereby provide optical isolation.

10. A micrometer scale light emitting diode (uLED) comprising:
    a growth substrate comprising: flat first and second regions, where the growth substrate is thicker in the first region as compared to the second region, and a third region of sloped sidewalls connecting the first and second regions, the topography forming a regular geometric pattern;
    a plurality of semiconductor epitaxial layers covering the first, second, and third regions including at least a p-n junction layer including a light emitting active region of direct bandgap semiconductor, sandwiched between n-type and p-type layers, each of the plurality of semiconductor epitaxial layers being thicker on the first and second regions as compared to the corresponding semiconductor epitaxial layers on the third region;
    an n-contact on the n-layer and a p-contact on the p-layer; and
    supporting underfill.

11. The uLED of claim 10, wherein the thinner epitaxial layers on the sidewall enables a high resistance to hole current between the n-contact and the p-contact, confining greater than 90% of forward bias hole injection to the first region.

12. The uLED of claim 11, wherein the high resistance is greater than 800 ohm/square.

13. The uLED of claim 10, wherein a perimeter of the first region forms a regular polygon having a number of sides greater than 3 and pitch less than 150 micrometers, and the angle between the first region and third region is between 95 and 120 degrees.

14. The uLED of claim 10, wherein the surfaces distal to the n-contact and p-contact are within 1 micrometer of the same height.

15. The uLED of claim 11, wherein the uLED is coupled to a thin film transistor (TFT) backplane chip.

16. The uLED of claim 11, further including an optic to control emission angle of light.

17. The uLED of claim 11, further including a ridge of reflecting material to form a barrier to contain the phosphor and reflect light back into the phosphor to thereby provide optical isolation.

18. A micrometer scale light emitting diode (uLED) wherein the uLED has a characteristic dimension of less than 100 micrometers, the uLED comprising:
    a growth substrate comprising: a flat first region, a flat second region, and a third region of sloped sidewalls connecting the first and second regions, the topography forming a regular geometric pattern;
    a plurality of semiconductor epitaxial layers covering the first, second, and third regions including at least a p-n junction layer including a light emitting active region of direct bandgap semiconductor, sandwiched between n-type and p-type layers, each of the plurality of semiconductor epitaxial layers being thicker on the first and second regions as compared to the corresponding semiconductor epitaxial layers on the third region; and
    an n-contact on the n-layer and a p-contact on the p-layer;
    wherein the uLED is coupled to a thin film transistor (TFT) backplane chip.

19. The uLED of claim 1 having a characteristic dimension of less than 100 micrometers.

20. The uLED of claim 10 having a characteristic dimension of less than 100 micrometers.

* * * * *

UNITED STATES PATENT AND TRADEMARK OFFICE
CERTIFICATE OF CORRECTION

PATENT NO. : 10,811,460 B2  
APPLICATION NO. : 16/144751  
DATED : October 20, 2020  
INVENTOR(S) : Dimitropoulos et al.

Page 1 of 1

It is certified that error appears in the above-identified patent and that said Letters Patent is hereby corrected as shown below:

In the Claims

In Claim 1, Column 15, Line 27, insert --a-- after "of" and before "direct".

In Claim 1, Column 15, Line 28, insert --each-- after "wherein" and before "of".

In Claim 4, Column 15, Line 44, delete "a nd" after "micrometers," and replace with "and".

In Claim 8, Column 15, Line 54, delete "," after "claim 1".

In Claim 8, Column 15, Line 54, replace "optics" with "optic".

In Claim 10, Column 16, Line 8, insert --a-- after "of" and before "direct".

In Claim 15, Column 16, Line 33, replace "claim 11" with "claim 10".

In Claim 16, Column 16, Line 35, replace "claim 11" with "claim 10".

In Claim 17, Column 16, Line 37, replace "claim 11," with "claim 10".

In Claim 18, Column 16, Line 51, insert --a-- after "of" and before "direct".

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*